(12) United States Patent
Yamamoto et al.

(10) Patent No.: US 12,474,686 B2
(45) Date of Patent: Nov. 18, 2025

(54) SUBSTRATE PROCESSING APPARATUS AND SUBSTRATE PROCESSING METHOD

(71) Applicant: Tokyo Electron Limited, Tokyo (JP)

(72) Inventors: Takari Yamamoto, Miyagi (JP);
Noriiki Masuda, Miyagi (JP);
Kenichiro Nakamura, Miyagi (JP);
Hiroshi Koizumi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 128 days.

(21) Appl. No.: 18/532,330

(22) Filed: Dec. 7, 2023

(65) Prior Publication Data
US 2024/0103482 A1   Mar. 28, 2024

Related U.S. Application Data

(63) Continuation of application No. 17/149,820, filed on Jan. 15, 2021, now abandoned, which is a
(Continued)

(51) Int. Cl.
*G05B 19/404* (2006.01)
*H01L 21/67* (2006.01)
*H01L 21/683* (2006.01)

(52) U.S. Cl.
CPC ...... *G05B 19/404* (2013.01); *H01L 21/67109* (2013.01); *H01L 21/67248* (2013.01);
(Continued)

(58) Field of Classification Search
CPC ........ G05B 19/404; G05B 2219/45031; G05B 2219/49057; H01L 21/67109;
(Continued)

(56) References Cited

U.S. PATENT DOCUMENTS

| 2007/0240825 A1 | 10/2007 | Kanno et al. |
| 2008/0255683 A1 | 10/2008 | Takahashi et al. |

(Continued)

FOREIGN PATENT DOCUMENTS

| CN | 101154565 A | 4/2008 |
| CN | 101911252 A | 12/2010 |

(Continued)

*Primary Examiner* — Mohammad Ali
*Assistant Examiner* — Saad M Kabir
(74) *Attorney, Agent, or Firm* — XSENSUS LLP

(57) ABSTRACT

A temperature control method of controlling a temperature of a semiconductor wafer mounted on a mounting table includes a supply process of supplying, in a state that a supply of a power to a heater configured to heat the mounting table is stopped or the power is maintained to be constant, a heat transfer gas into a gap between the semiconductor wafer and the mounting table; a measurement process of measuring a temperature variation of the mounting table due to heat exchange between the semiconductor wafer and the mounting table through the heat transfer gas; a calculation process of calculating a correction value based on the temperature variation of the mounting table; and a control process of starting the supply of the power and controlling the power such that the temperature of the mounting table reaches a target temperature corrected with the correction value.

19 Claims, 13 Drawing Sheets

Related U.S. Application Data continuation of application No. 15/189,195, filed on Jun. 22, 2016, now Pat. No. 10,921,773.

(52) U.S. Cl.
CPC .................. *H01L 21/6831* (2013.01); *G05B 2219/45031* (2013.01); *G05B 2219/49057* (2013.01)

(58) Field of Classification Search
CPC ........... H01L 21/67248; H01L 21/6831; H01L 21/02; H01L 22/12; H01L 21/324; H01L 21/67098; H01L 21/6835
USPC ....................................................... 700/300
See application file for complete search history.

(56) References Cited

U.S. PATENT DOCUMENTS

| | | |
|---|---|---|
| 2009/0008381 A1 | 1/2009 | Jyousaka et al. |
| 2009/0133839 A1 | 5/2009 | Yamazawa et al. |

FOREIGN PATENT DOCUMENTS

| | | |
|---|---|---|
| JP | 2009-302390 A | 12/2009 |
| WO | 2009/090899 A1 | 7/2009 |

| CENTER REGION | | EDGE REGION | |
|---|---|---|---|
| GRADIENT | CORRECTION VALUE | GRADIENT | CORRECTION VALUE |
| 0.23 | −4.5 | 0.21 | −5.5 |
| 0.33 | 0 | 0.32 | 0 |
| 0.42 | +3.3 | 0.43 | +4.0 |

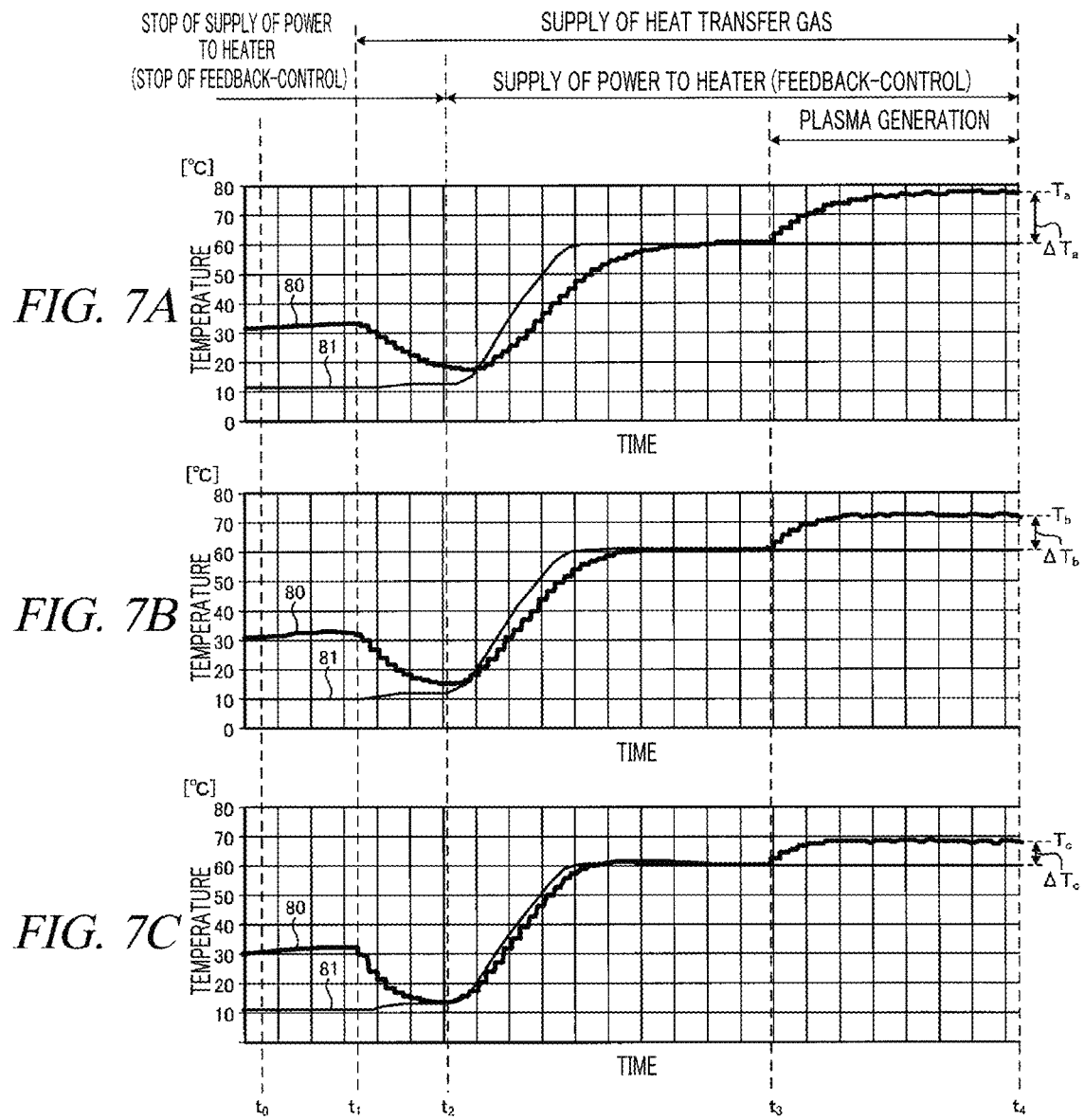

| PRESSURE OF HEAT TRANSFER GAS(Torr) | CENTER REGION | | EDGE REGION | |
|---|---|---|---|---|
| | GRADIENT OF TEMPERATURE VARIATION (Δ°C/sec) | TEMPERATURE OF TEMPERATURE MEASUREMENT WAFER W' (°C) | GRADIENT OF TEMPERATURE VARIATION (Δ°C/sec) | TEMPERATURE OF TEMPERATURE MEASUREMENT WAFER W' (°C) |
| 5 | 0.23 | 74.4 | 0.21 | 77.8 |
| 10 | 0.33 | 69.9 | 0.32 | 72.2 |
| 20 | 0.42 | 66.6 | 0.43 | 68.2 |

| | CENTER REGION | EDGE REGION |
|---|---|---|
| RELATIONAL EXPRESSION | y=0.0121x+0.185 | y=0.0141x+0.155 |
| TARGET VALUE OF GRADIENT | 0.3 | 0.3 |

2043

SUBSTRATE PROCESSING APPARATUS AND SUBSTRATE PROCESSING METHOD

CROSS-REFERENCE TO RELATED APPLICATION

This is a continuation application of U.S. patent application Ser. No. 17/149,820 filed on Jan. 15, 2021, which is a continuation of U.S. patent application Ser. No. 15/189,195 filed on Jun. 22, 2016, now issued as U.S. Pat. No. 10,921,773, which claims the benefit of Japanese Patent Application No. 2015-126769 filed on Jun. 24, 2015, the entire disclosures of which are incorporated herein by reference.

TECHNICAL FIELD

The embodiments described herein pertain generally to a temperature control method.

BACKGROUND

In a manufacturing process of a semiconductor device, a temperature of a semiconductor wafer being processed is one of important factors that affect a characteristic of the semiconductor device. Accordingly, in the manufacturing process, it is required to control the temperature of the semiconductor wafer with high accuracy. To meet this requirement, there is known a technique in which variations of a power supplied to a heater, a temperature of a sample and a temperature of a temperature sensor with a lapse of time, for example, are measured in advance under a condition where no plasma process is performed, and a relationship between these measurement values is approximated to a first-order simultaneous differential equation. In this technique, through the same observation based on the approximated first-order simultaneous differential equation, the temperature of the sample is predicted from the variations of the sensor temperature, the heater power and the heat input from plasma with a lapse of time. Then, by using the predicted temperature of the sample, the temperature of the sample is feedback-controlled.

Patent Document 1: Japanese Patent Laid-open Publication No. 2009-302390

In a mass-production process of semiconductor wafers, as a processing apparatus performs a certain process repeatedly upon the semiconductor wafers, an environment within the processing apparatus may be gradually changed. For example, in a processing apparatus configured to form preset films on a semiconductor wafer, as the process is performed upon multiple semiconductor wafers, the amount of a reaction byproduct (hereinafter, referred to as "deposit") adhering to an inner wall of the processing apparatus increases. If the deposit is stuck to a surface of a mounting table configured to mount thereon the semiconductor wafer, thermal resistance between the semiconductor wafer and the mounting table is changed. If the thermal resistance between the semiconductor wafer and the mounting table is changed, temperatures of the semiconductor wafers during the processes are different therebetween even if a temperature of, for example, a heater provided in the mounting table is maintained constant. As a result, a processing condition becomes different between the multiple semiconductor wafers, so that characteristics of the semiconductor devices produced from these semiconductor wafers are non-uniform as well.

It may be considered to remove the deposit by performing a cleaning process on the inside of the processing apparatus after every preset number of semiconductor wafers is processed. Since, however, the amount of the deposit is different before and after the cleaning process, the thermal resistance between the mounting table and each semiconductor wafer is still slightly different. Furthermore, if the cleaning process is frequently performed, throughput of the mass-production process for the semiconductor wafers is deteriorated.

SUMMARY

A temperature control method of controlling a temperature of a processing target object mounted on a mounting surface of a mounting table includes a supply process of supplying, in a state that a supply of a power to at least one heater configured to heat the mounting table is stopped or in a state that the power supplied to the at least one heater is maintained to be constant, a heat transfer gas into a gap between the processing target object and the mounting table on which the processing target object having a temperature different from a temperature of the mounting table is mounted; a measurement process of measuring a temperature variation of the mounting table due to heat exchange between the processing target object and the mounting table through the heat transfer gas; a calculation process of calculating a correction value based on the temperature variation of the mounting table; and a control process of starting the supply of the power to the at least one heater and controlling the power to the at least one heater such that the temperature of the mounting table reaches a target temperature corrected with the correction value.

In one exemplary embodiment, a temperature control method of controlling a temperature of a processing target object mounted on a mounting surface of a mounting table includes a supply process, a first measurement process, a calculation process and a control process. In the supply process, in a state that a supply of a power to at least one heater configured to heat the mounting table is stopped or in a state that the power supplied to the at least one heater is maintained to be constant, a heat transfer gas is supplied into a gap between the processing target object and the mounting table on which the processing target object having a temperature different from a temperature of the mounting table is mounted. In the first measurement process, a temperature variation of the mounting table due to heat exchange between the processing target object and the mounting table through the heat transfer gas is measured. In the calculation process, a correction value is calculated based on the temperature variation of the mounting table. In the control process, the supply of the power to the at least one heater is started, and the power to the at least one heater is controlled such that the temperature of the mounting table reaches a target temperature corrected with the correction value.

In the first measurement process, a gradient of the temperature variation of the mounting table in a time period between a first time point upon the lapse of a first time after the heat transfer gas is supplied into the gap between processing target object and the mounting table and a second time point upon the lapse of a second time from the first time point may be measured as the temperature variation of the mounting table.

The temperature control method may further include a second measurement process and a creation process. In the second measurement process, in the state that the supply of the power to the at least one heater configured to heat the mounting table is stopped or in the state that the power supplied to the at least one heater is maintained to be constant, the heat transfer gas is supplied into the gap between a temperature measurement wafer having a temperature different from the temperature of the mounting table and the mounting table on which the temperature measurement wafer is mounted and the temperature variation of the mounting table due to heat exchange between the temperature measurement wafer and the mounting table through the heat transfer gas is measured. Then, the temperature of the temperature measurement wafer is measured by controlling the power to the at least one heater such that the temperature of the mounting table reaches a preset temperature. In the creation process, a correction table, in which the temperature variation of the mounting table measured in the second measurement process corresponds to the correction value according to a difference between the temperature of the temperature measurement wafer measured in the second measurement process and a reference temperature, is created for each of different pressures of the heat transfer gas. In the calculation process, the correction value based on the temperature variation of the mounting table is calculated from the correction table.

The supply process, the first measurement process, the calculation process and the control process may be performed on the processing target object before the processing target object is processed.

The heat transfer gas may be supplied into the gap between the processing target object and the mounting table through multiple supply holes formed in the mounting surface of the mounting table.

The at least one heater may be plural in number, and the heaters may be provided within the mounting table in concentric shapes having different radii when viewed from above the mounting table.

The correction value based on the temperature variation of the mounting table may be calculated for each of the heaters in the calculation process, and the power to each of the heaters may be controlled such that the temperature of the mounting table reaches the target temperature in the control process.

In another exemplary embodiment, a temperature control method of controlling a temperature of a processing target object mounted on a mounting surface of a mounting table includes a supply process, a first measurement process, a first calculation process and a control process. In the supply process, in a state that a supply of a power to at least one heater configured to heat the mounting table is stopped or in a state that the power supplied to the at least one heater is maintained to be constant, a heat transfer gas of a first pressure is supplied into a gap between the processing target object and the mounting table on which the processing target object having a temperature different from a temperature of the mounting table is mounted. In the first measurement process, a temperature variation of the mounting table due to heat exchange between the processing target object and the mounting table through the heat transfer gas is measured. In the first calculation process, a second pressure of the heat transfer gas is calculated based on the temperature variation of the mounting table. In the control process, the supply of the power to the at least one heater is started, a pressure of the heat transfer gas supplied into the gap between the mounting table and the processing target object is set to the second pressure, and the power to the at least one heater is controlled such that the temperature of the mounting table reaches a target temperature.

In the first measurement process, a gradient of the temperature variation of the mounting table in a time period between a first time point upon the lapse of a first time after the heat transfer gas is supplied into the gap between the processing target object and the mounting table and a second time point upon the lapse of a second time from the first time point may be measured as the temperature variation of the mounting table.

The temperature control method may further include a second measurement process, a second calculation process and a third calculation process. In the second measurement process, in the state that the supply of the power to the at least one heater configured to heat the mounting table is stopped or in the state that the power supplied to the at least one heater is maintained to be constant, the heat transfer gas is supplied into the gap between a temperature measurement wafer having a temperature different from the temperature of the mounting table and the mounting table on which the temperature measurement wafer is mounted and the temperature variation of the mounting table due to heat exchange between the temperature measurement wafer and the mounting table through the heat transfer gas is measured. Then, the temperature of the temperature measurement wafer is measured by controlling the power to the at least one heater such that the temperature of the mounting table reaches a preset temperature. In the second calculation process, for each of different pressures of the heat transfer gas, a relational expression indicating a relation between the pressure of the heat transfer gas and the gradient of the temperature variation is calculated based on the gradient of the temperature variation of the mounting table measured in the second measurement process. In the third calculation process, as a target gradient of the temperature variation, the gradient of the temperature variation of the mounting table obtained when the temperature of the temperature measurement wafer measured in the second measurement process reaches a reference temperature is calculated. In the first calculation process, the second pressure is calculated based on the relational expression calculated in the second calculation process and the target gradient of the temperature variation calculated in the third calculation process.

The supply process, the first measurement process, the first calculation process and the control process may be performed on the processing target object before the processing target object is processed.

The heat transfer gas may be supplied through multiple supply holes formed in the mounting surface of the mounting table.

The at least one heater may be plural in number, and the heaters may be provided within the mounting table in concentric shapes having different radii when viewed from above the mounting table.

The pressure of the heat transfer gas may be independently controlled in regions of the mounting surface on which the heaters are provided.

According to the exemplary embodiments, the non-uniformity in the temperatures of the semiconductor wafers can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7A to FIG. 7C are diagrams illustrating examples of temperature variations of a temperature measurement wafer and the electrostatic chuck in creating the correction table;

DETAILED DESCRIPTION

Figure 1:
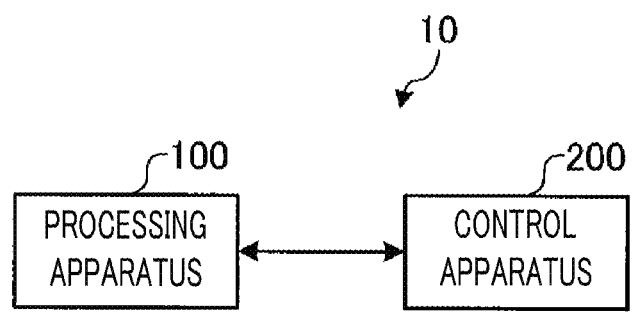
FIG. 1 is a diagram illustrating an example of a processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Exemplary Embodiment

<Processing System 10>

FIG. 1 is a diagram illustrating an example of a processing system 10. As depicted in FIG. 1, for example, the processing system 10 includes a processing apparatus 100 and a control apparatus 200. The processing apparatus 100 is configured to perform a preset process such as a plasma etching process, a plasma CVD (Chemical Vapor Deposition) process or a heat treatment on a semiconductor wafer W as an example of a processing target object. The control apparatus 200 is configured to control the processing apparatus 100 based on information sent from various kinds of sensors such as a temperature sensor provided in the processing apparatus 100, and configured to allow the processing apparatus 100 to perform the preset process on the semiconductor wafer W which is placed in the processing apparatus 100.

<Processing Apparatus 100>

Figure 2:
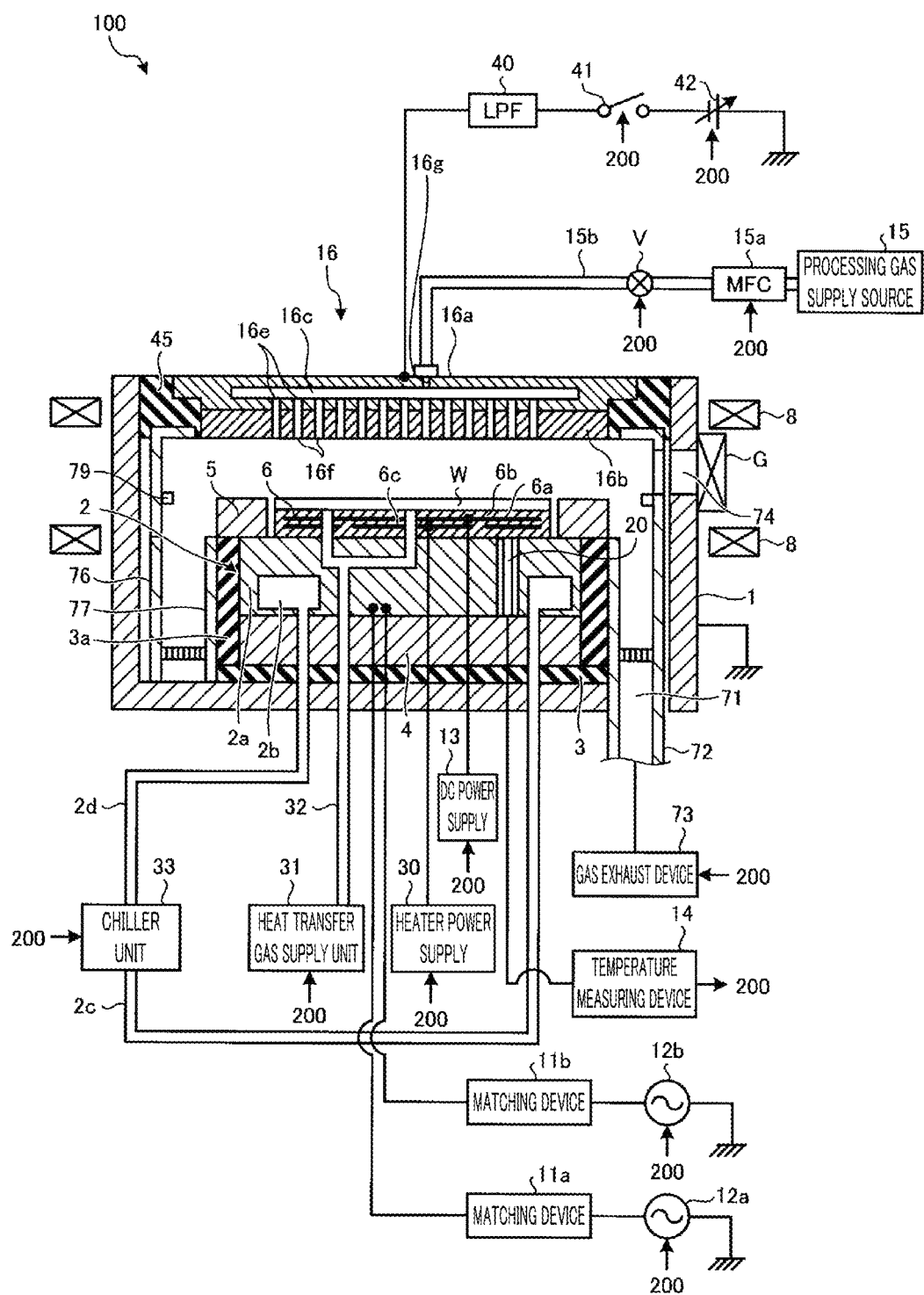
FIG. 2 is a cross sectional view illustrating an example of a processing apparatus.

FIG. 2 is a cross sectional view illustrating an example of the processing apparatus 100. The processing apparatus 100 includes a hermetically sealed processing chamber 1, as illustrated in FIG. 2, for example. The processing chamber 1 is made of, by way of non-limiting example, aluminum having an anodically oxidized surface and has a substantially cylindrical shape. The processing chamber 1 is grounded. A mounting table 2 configured to mount thereon a semiconductor wafer W horizontally is provided within the processing chamber 1.

The mounting table 2 includes a base 2a and an electrostatic chuck 6. The base 2a is made of a conductive metal such as, but not limited to, aluminum. The mounting table 2 also serves as a lower electrode. The base 2a is supported on a conductive supporting table 4. The supporting table 4 is provided on a bottom portion of the processing chamber 1 with an insulating plate 3 therebetween. Further, a focus ring 5 made of, by way of non-limiting example, single crystalline silicon is provided on a periphery portion of a top surface of the mounting table 2. Further, a cylindrical inner wall member 3a made of, for example, quartz is provided to surround the mounting table 2 and the supporting table 4.

The electrostatic chuck 6 is provided on a top surface of the base 2a. The electrostatic chuck 6 is configured to attract and hold the semiconductor wafer W and is also configured to heat the semiconductor wafer W. The electrostatic chuck 6 includes an insulator 6b, an electrode 6a embedded in the insulator 6a and a heater 6c. The electrode 6a is connected to a DC power supply 13. A Coulomb force is generated on a surface of the electrostatic chuck 6 by a DC voltage applied from the DC power supply 13, and the semiconductor wafer W is attracted and held on the top surface of the electrostatic chuck 6 by the generated Coulomb force. An on/off operation of the DC power supply 13 is controlled by the control apparatus 200 to be described later. The heater 6c is connected to a heater power supply 30 and is configured to heat the electrostatic chuck 6 by a power supplied from the heater power supply 30. A supply of the power to the heater 6c from the heater power supply 30 and a stop of the supply of the power to the heater 6c are controlled by the control apparatus 200 to be described later. Further, in the present exemplary embodiment, a magnitude of the power supplied to the heater 6c is controlled by the heater power supply 30 in response to an instruction from the control apparatus 200 to be described later.

Further, the electrostatic chuck 6 is also configured to heat the semiconductor wafer W by heat from the heater 6c. The top surface of the electrostatic chuck 6 is divided into multiple division regions, and each division region is provided with the heater 6c. The top surface of the electrostatic chuck 6 corresponds to a mounting surface of the mounting table 2.

A temperature sensor 20 is provided at a bottom surface of the electrostatic chuck 6. The temperature sensor 20 is connected to a temperature measuring device 14. Each division region is provided with the temperature sensor 20, and each temperature sensor 20 is configured to detect information indicating a temperature of the electrostatic chuck 6 in each division region and output the detected information to the temperature measuring device 14. The temperature measuring device 14 is configured to measure the temperature of the electrostatic chuck 6 in each division region based on the information output from the temperature sensor 20 and output the measured temperature to the control apparatus 200.

Formed within the base 2a is a flow path 2b through which a coolant is flown. The flow path 2b is connected to a chiller unit 33 via pipelines 2c and 2d. The chiller unit 33 is configured to cool the mounting table 2 by circulating the coolant such as Galden having a controlled temperature within the flow path 2b via the pipelines 2c and 2d. The chiller unit 33 controls a start and a stop of the flow of the coolant into the flow path 2b in response to an instruction from the control apparatus 200.

Further, the mounting table 2 is equipped with a pipeline 32 which penetrates the base 2a and the electrostatic chuck 6 and through which a heat transfer gas (backside gas) such as a helium gas is supplied to a rear surface of the semiconductor wafer W. Each division region of the top surface of the electrostatic chuck 6 is provided with the pipeline 32, and each pipeline 32 is connected to a heat transfer gas supply unit 31. In each division region, the top surface of the electrostatic chuck 6 is provided with a multiple number of supply holes through which the heat transfer gas is supplied. In each division region, the heat transfer gas supplied from the heat transfer gas supply unit 31 is introduced via the pipeline 32 into a gap between the top surface of the electrostatic chuck 6 and the rear surface of the semiconductor wafer W from the multiple number of supply holes formed in the top surface of the electrostatic chuck 6. A pressure of the heat transfer gas can be controlled for each division region independently. The pressure of the heat transfer gas supplied to the rear surface of the semiconductor wafer W from the heat transfer gas supply unit 31 through the pipeline 32 is controlled by the control apparatus 200 to be described later. Further, the temperature of the electrostatic chuck 6 is an example of a temperature of the mounting table on which the semiconductor wafer W is mounted.

A shower head 16 is provided above the mounting table 2, facing the mounting table 2 substantially in parallel, i.e., facing the semiconductor wafer W mounted on the mounting table 2. The shower head 16 also serves as an upper electrode. That is, the shower head 16 and the mounting table 2 are configured as a pair of electrodes (upper electrode and lower electrode). The base 2a of the mounting table 2 is connected to a high frequency power supply 12a via a matching device 11a. Further, the base 2a of the mounting table 2 is also connected to a high frequency power supply 12b via a matching device 11b.

The high frequency power supply 12a is configured to supply a high frequency power of a preset frequency (e.g., 100 MHz) for plasma generation to the base 2a of the mounting table 2. Further, the high frequency power supply 12b is configured to supply a high frequency power of a predetermined frequency (e.g., 13 MHz) for ion attraction (bias) to the base 2a of the mounting table 2. The frequency of the high frequency power from the high frequency power supply 12b is lower than the frequency of the high frequency power from the high frequency power supply 12a. On/off operations of the high frequency power supplies 12a and 12b, the high frequency powers supplied by the high frequency power supplies 12a and 12b, and so forth are controlled by the control apparatus 200 to be described later.

The control apparatus 200 is capable of adjusting the temperature of the semiconductor wafer W attracted and held on the top surface of the electrostatic chuck 6 to a preset temperature by controlling the heater power supply 30, the chiller unit 33 and the heat transfer gas supply unit 31.

The shower head 16 is provided at an upper portion of the processing chamber 1. The shower head 16 includes a main body 16a and an upper ceiling plate 16b. The shower head 16 is supported at the upper portion of the processing chamber 1 with an insulating member 45 therebetween. The main body 16a is formed of, by way of example, but not limitation, aluminum having an anodically oxidized surface and supports the upper ceiling plate 16b provided therebelow in a detachable manner. The upper ceiling plate 16b is made of a silicon-containing material such as, but not limited to, quartz.

A gas diffusion space 16c is formed within the main body 16a. A multiple number of gas through holes 16e is formed in a bottom portion of the main body 16a to be located under the gas diffusion space 16c. The upper ceiling plate 16b is provided with gas discharge holes 16f which are formed through the upper ceiling plate 16b in a thickness direction thereof. The gas discharge holes 16f respectively communicate with the gas through holes 16e. With this configuration, a processing gas supplied into the gas diffusion space 16c is introduced into the processing chamber 1 through the gas through holes 16e and the gas discharge holes 16f while being diffused in a shower shape. Further, the main body 16a or the like is equipped with a temperature control mechanism such as a non-illustrated heater or a non-illustrated pipeline for circulating a coolant, and a temperature of the shower head 16 can be controlled within a required temperature range while processing the semiconductor wafer W.

The main body 16a of the shower head 16 is also provided with a gas inlet opening 16g through which the processing gas is introduced into the gas diffusion space 16c. The gas inlet opening 16g is connected with one end of a pipeline 15b, and the other end of the pipeline 15b is connected via a valve V and a mass flow controller MFC 15a to a processing gas supply source 15 which is configured to supply the processing gas for the processing of the semiconductor wafer W. The processing gas supplied from the processing gas supply source 15 is introduced into the gas diffusion space 16c through the pipeline 15b and is supplied into the processing chamber 1 through the gas through holes 16e and the gas discharge holes 16f while being diffused in the shower shape. The valve V and the MFC 15a are controlled by the control apparatus 200 to be described later.

The shower head 16 is electrically connected to a variable DC power supply 42 via a low pass filter LPF 40. The variable DC power supply 42 is configured to start and stop a supply of a DC power to the main body 16a through a switch 41. An electric current and a voltage of the variable DC power supply 42 and an on/off operation of the switch 41 are controlled by the control apparatus 200 to be described later. For example, when plasma is generated within a processing space of the processing chamber 1 by applying the high frequency powers from the high frequency power supplies 12a and 12b to the mounting table 2, the switch 41 is turned on by the control apparatus 200, when necessary, so that a preset DC voltage is applied to the shower head 16 which serves as the upper electrode.

A gas exhaust opening 71 is formed at the bottom portion of the processing chamber 1. The gas exhaust opening 71 is connected with a gas exhaust device 73 via a gas exhaust line 72. The gas exhaust device 73 includes a vacuum pump, and is capable of decompressing the inside of the processing chamber 1 to a preset vacuum level by operating the vacuum pump. A gas exhaust amount by the gas exhaust device 73 is controlled by the control apparatus 200 to be described later. An opening 74 is formed at a sidewall of the processing chamber 1, and a gate valve G configured to open or close the opening 74 is provided at the opening 74.

A deposition shield 76 is provided along an inner wall of the processing chamber 1 in a detachable manner. Further, a deposition shield 77 is provided on outer surfaces of the mounting table 2, the inner wall member 3a and the supporting table 4. The deposition shields 76 and 77 are configured to suppress an etching byproduct (deposit) from adhering to the inner wall of the processing chamber 1. Further, a conductive member (GND block) 79 which is DC-connected to the ground, is provided at a position of the deposition shield 76 which is substantially on a level with the semiconductor wafer W held on the electrostatic chuck 6. The conductive member 79 is configured to suppress an abnormal discharge within the processing chamber 1.

Further, ring magnets 8 are concentrically arranged around the processing chamber 1. The ring magnets 8 form magnetic fields in a space between the shower head 16 and the mounting table 2. The ring magnets 8 are provided to be rotatable by a non-illustrated rotating device.

<Electrostatic Chuck 6>

Figure 3:
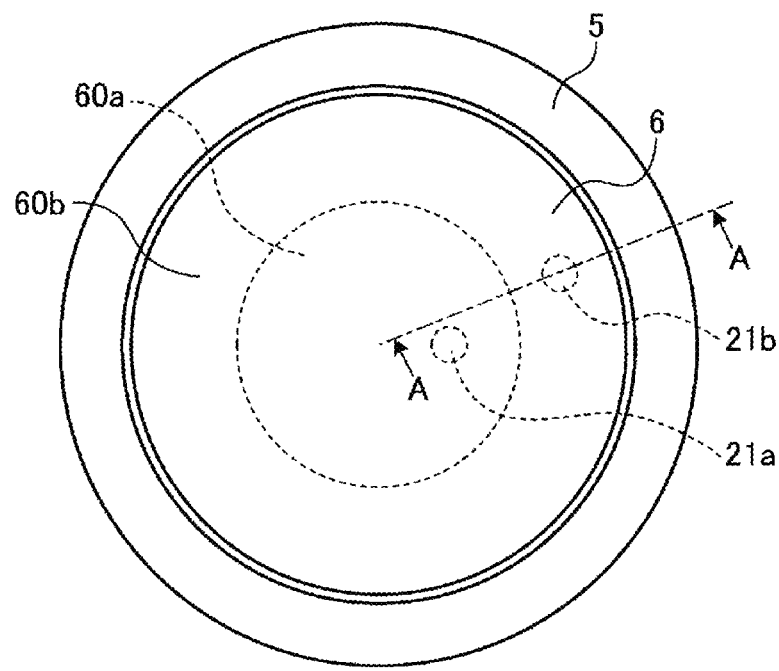
FIG. 3 is a diagram illustrating an example of a top surface of an electrostatic chuck.
Figure 4:
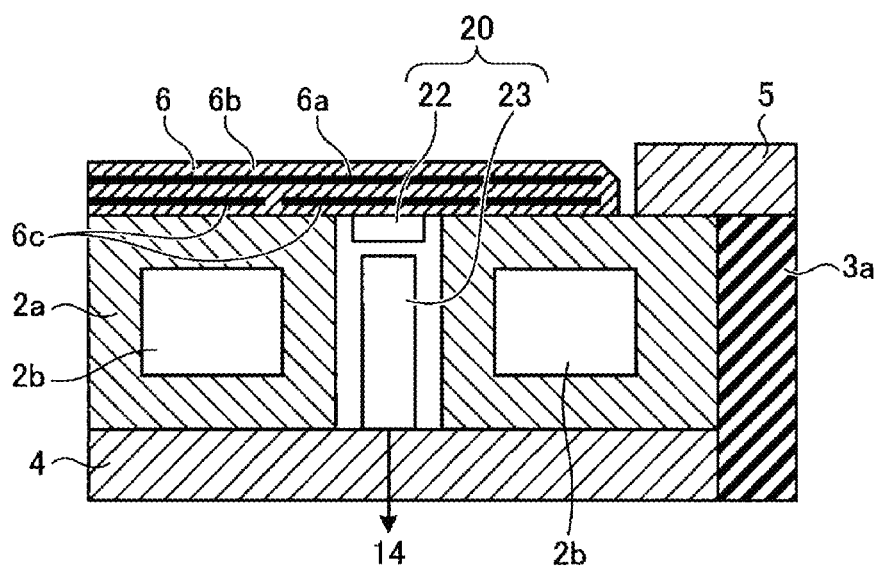
FIG. 4 is a diagram illustrating an example of a cross section taken along a line A-A of FIG. 3.

FIG. 3 is a diagram illustrating an example of the top surface of the electrostatic chuck 6. FIG. 4 is a diagram illustrating an example of a cross section taken along a line A-A of FIG. 3. Around the electrostatic chuck 6, the focus ring 5 is provided to surround the electrostatic chuck 6. The top surface of the electrostatic chuck 6 on which the semiconductor wafer W is placed is divided into multiple concentric division regions, for example. In the present exemplary embodiment, the top surface of the electrostatic chuck 6 is divided into two division regions 60a and 60b, for example. Further, in the following description, the division region 60a may also be referred to as a center region, and the division region 60b may also be referred to as an edge region. Furthermore, in the following description, when it is not necessary to distinguish the division regions 60a and 60b, they will be generically referred to as a division region 60.

By way of example, as depicted in FIG. 4, the heater 6c is provided under each division region 60 within the electrostatic chuck 6 to correspond to each division region 60. Alternatively, the heater 6c may be provided at the outside of the electrostatic chuck 6. The control apparatus 200 is capable of controlling temperatures of the individual division regions 60 independently by controlling the powers supplied to the heaters 6c from the heater power supply 30.

For instance, as illustrated in FIG. 4, at least one temperature sensor 20 is provided at the bottom surface of the electrostatic chuck 6 to correspond to each division region 60. In the present exemplary embodiment, one temperature sensor 20 is provided at a region 21a within the division region 60a and another temperature sensor 20 is provided at a region 21b within the division region 60b, as illustrated in FIG. 3.

The temperature sensor 20 includes, as shown in FIG. 4, a temperature sensing body 22 and a detecting unit 23. A characteristic of the temperature sensing body 22 is changed depending on a temperature. In the present exemplary embodiment, the temperature sensing body 22 is a fluorescent substance and the fluorescence characteristic thereof varies depending on a temperature of the electrostatic chuck 6. The detecting unit 23 is configured to detect the characteristic of the temperature sensing body 22 which is changed depending on the temperature, and output the detecting result to the temperature measuring device 14. In the present exemplary embodiment, the detecting unit 23 may be, by way of non-limiting example, an optical fiber and is configured to irradiate pulse light output from the temperature measuring device 14 to the temperature sensing body 22 and transmit light emitted from the temperature sensing device 22 depending on the irradiated pulse light.

The temperature measuring device 14 is configured to measure the temperature of each division region 60 based on a signal outputted from the temperature sensor 20 provided in each division region 60, and is configured to output information of the measured temperature for each division region 60 to the control apparatus 200. For example, the temperature measuring device 14 transmits the pulse light to the temperature sensing body 22 through the detecting unit 23, and measures the temperature of each division region 60 where the corresponding temperature sensing body 22 is provided, based on the optical attenuation rate of the light of the temperature sensing body 22 received through the detecting unit 23.

<Control Apparatus 200>

Figures 5, 6:
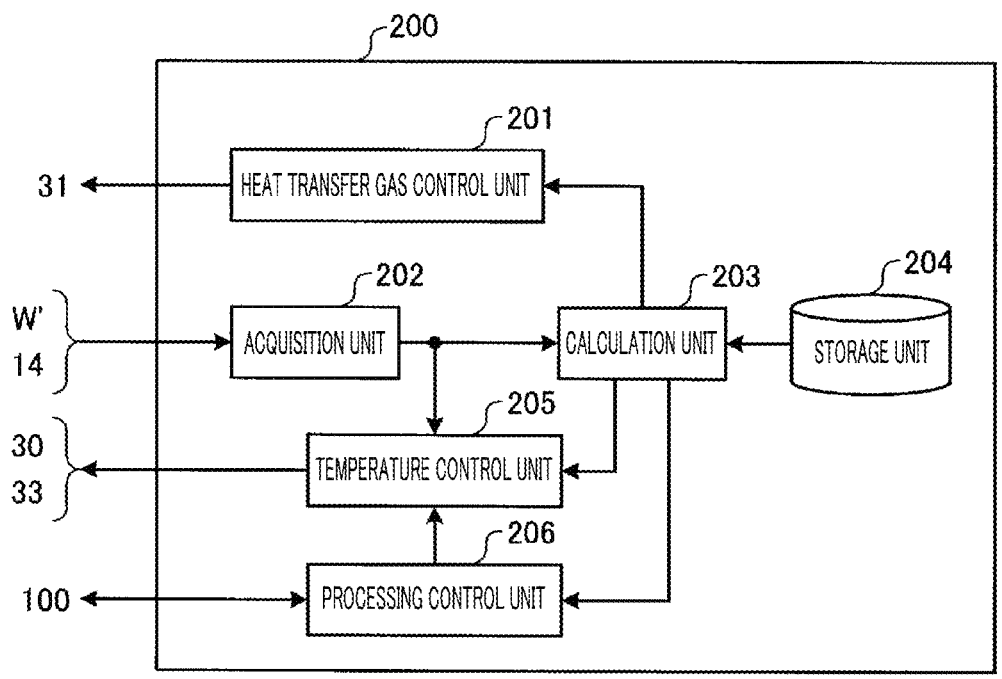
FIG. 5 is a block diagram illustrating an example of a control apparatus.
FIG. 6 is a diagram illustrating an example of a correction table according to a first exemplary embodiment.

FIG. 5 is a block diagram illustrating an example of the control apparatus 200. The control apparatus 200 includes, as depicted in FIG. 5, a heat transfer gas control unit 201, an acquisition unit 202, a calculation unit 203, a storage unit 204, a temperature control unit 205 and a processing control unit 206.

The storage unit 204 is configured to store therein a correction table 2040 as illustrated in FIG. 6, for example. FIG. 6 is a diagram illustrating an example of the correction table 2040 according to the first exemplary embodiment. Individual tables 2041 for the corresponding division regions 60 are stored in the correction table 2040. Stored in each individual table 2041 are correction values which are applied when controlling the temperature of the electrostatic chuck 6 to a preset temperature. In each individual table 2041, the correction values corresponding to gradients of the temperature variations of the electrostatic chuck 6 are provided.

Referring back to FIG. 5, the heat transfer gas control unit 201 is configured to instruct the heat transfer gas supply unit 31 to start or stop the supply of the heat transfer gas in response to an instruction from the calculation unit 203. Further, the heat transfer gas control unit 201 is configured to send an instruction indicating a pressure of the heat transfer gas to the heat transfer gas supply unit 31 in response to an instruction from the calculation unit 203.

The acquisition unit 202 is configured to acquire information of the measured temperature in each division region 60 from the temperature measuring device 14. Then, the acquisition unit 202 is configured to output the acquired information of the temperature in each division region 60 to the calculation unit 203 and the temperature control unit 205. Further, when creating the correction table 2040, the acquisition unit 202 is configured to acquire information of a temperature of a temperature measurement wafer W' which is loaded into the processing chamber 1 of the processing apparatus 100, and output the acquired information to the calculation unit 203.

The temperature measurement wafer W' includes a multiple number of temperature sensors provided on a surface of the temperature measurement wafer W'; and a communication unit configured to output information of temperatures measured by the temperature sensors to the control apparatus 200. When mounted on the electrostatic chuck 6, at least one temperature sensor is provided at each region on the temperature measurement wafer W' corresponding to each division region 60 of the electrostatic chuck 6. The communication unit is configured to wirelessly transmit the information of the temperature of each division region 60 measured by the corresponding temperature sensor to the control apparatus 200. Further, the communication unit may be configured to transmit the information of the temperature of each division region 60 to the control apparatus 200 through wire communications. Further, the temperature measurement wafer W' may be equipped with a non-volatile storage memory instead of the communication unit and may store the information of the temperature of each division region 60 measured by the corresponding temperature sensor in the storage memory. In such a case, after the temperature measurement wafer W' is taken out from the processing chamber 1, the acquisition unit 202 of the control apparatus 200 reads out the information of the temperature in each division region 60 measured by the corresponding temperature sensor from the storage memory.

The temperature control unit 205 is configured to control the heater power supply 30 and the chiller unit 33 in response to instructions from the calculation unit 203. If the calculation unit 203 instructs the temperature control unit 205 to start cooling of the electrostatic chuck 6, the temperature control unit 205 instructs the chiller unit 33 to circulate the coolant of a preset temperature through the flow path 2b of the base 2a. Further, in response to an instruction from the calculation unit 203 to stop the supply of the power to the heater 6c within the electrostatic chuck 6 or to maintain the power supplied to the heater 6c to be constant, the temperature control unit 205 instructs the heater power supply 30 to stop the supply of the power to the heater 6c or to maintain the power supplied to the heater 6c to be constant.

Furthermore, when creating the correction table 2040, the temperature control unit 205 receives information of a target temperature from the processing control unit 206. In response to an instruction from the calculation unit 203 to start the supply of the power to the heater 6c, the temperature control unit 205 instructs the heater power supply 30 to start the supply of the power to the heater 6c. Further, based on the temperature information of each division region 60 output from the acquisition unit 202, the temperature control unit 205 feedback-controls the power supplied to the heater 6c provided in each division region 60 such that the temperature of the division region 60 reaches the target temperature.

Further, when processing the semiconductor wafer W, the temperature control unit 205 receives a correction value of each division region 60 from the calculation unit 203 and receives information of a target temperature from the processing control unit 206. In response to an instruction from the calculation unit 203 to start the supply of the power to the heater 6c, the temperature control unit 205 instructs the heater power supply 30 to start the supply of the power to the heater 6c. Then, the temperature control unit 205 corrects the target temperature of each division region 60 based on the correction value. Then, based on the temperature information of each division region 60 output from the acquisition unit 202, the temperature control unit 205 feedback-controls the power supplied to the heater 6c such that the temperature of each division region 60 reaches a corrected target temperature. Accordingly, the temperature of the semiconductor wafer W mounted on the electrostatic chuck 6 is controlled to reach a temperature which amounts to a sum of the corrected target temperature and a temperature difference generated between the semiconductor wafer W and the electrostatic chuck 6 due to a thermal resistance therebetween. The calculation unit 203 corrects the target temperature by decreasing the target temperature when the thermal resistance between the semiconductor wafer W and the electrostatic chuck 6 is high, and corrects the target temperature by increasing the target temperature when the thermal resistance between the semiconductor wafer W and the electrostatic chuck 6 is low. Accordingly, the temperature control unit 205 is capable of suppressing non-uniformity in temperatures of multiple semiconductor wafers W even in case that the thermal resistance between the semiconductor wafers W and the electrostatic chuck 6 is changed.

When creating the correction table 2040, the processing control unit 206 outputs the target temperature in creating the correction table 2040 to the temperature control unit 205 in response to an instruction from the calculation unit 203. Then, the processing control unit 206 controls the individual components of the processing apparatus 100 in response to instructions from the calculation unit 203. Further, when processing the semiconductor wafer W, the processing control unit 206 outputs a target temperature specified in a processing recipe set by an operator of the processing apparatus 100 or the like to the temperature control unit 205. Then, the processing control unit 206 processes the semiconductor wafer W by controlling the individual components of the processing apparatus 100 based on the processing recipe.

The calculation unit 203 controls the heat transfer gas control unit 201, the temperature control unit 205 and the processing control unit 206 when creating the correction table 2040 and when processing the semiconductor wafer W. Now, referring to FIG. 7A to FIG. 8C, details of processes performed by the calculation unit 203 will be discussed.

<Creation of Correction Table 2040>

FIG. 7A to FIG. 7C are diagrams illustrating examples of the temperature variations of the temperature measurement wafer W' and the electrostatic chuck 6 creating the correction table 2040. FIG. 7A to FIG. 7C illustrate examples of the temperature variations of the temperature measurement wafer W' and the electrostatic chuck 6 at a region corresponding to one division region (e.g., center region) on the electrostatic chuck 6. Further, in the following description, with regard to the correction table 2040, a process of creating an individual table 2041 for the one division region 60 will be explained. Since a process of creating an individual table 2041 for another division region 60 is the same as this process, the process of creating the individual table 2041 for another division region 60 will be omitted herein.

FIG. 7A shows examples of the temperature variations of the temperature measurement wafer W' and the electrostatic chuck when a pressure of the heat transfer gas is 5 Torr; FIG. 7B, when a pressure of the heat transfer gas is 10 Torr and FIG. 7C, when the pressure of the heat transfer gas is 20 Torr. In FIG. 7A to FIG. 7C, a graph 80 indicates the temperature variation of the temperature measurement wafer W' and a graph 81 indicates the temperature variation of the electrostatic chuck 6.

When creating the correction table 2040, the calculation unit 203 first instructs the temperature control unit 205 to start the cooling of the electrostatic chuck 6 and to stop the supply of the power to the heater 6c or maintain the power supplied to the heater 6c to be constant. Accordingly, the electrostatic chuck 6 is cooled through the base 2a which is cooled by the coolant circulated within the flow path 2b of the base 2a. Then, the calculation unit 203 instructs a non-illustrated transfer robot to carry the temperature measurement wafer W' into the processing chamber 1 and mount the temperature measurement wafer W' on the electrostatic chuck 6.

Further, as illustrated in FIG. 7A to FIG. 7C, at a time to when the temperature measurement wafer W' is mounted on the electrostatic chuck 6, the temperature measurement wafer W' is kept to have a room temperature (e.g., 30° C.) and the electrostatic chuck 6 is cooled to have a temperature (e.g., 10° C.) lower than the room temperature. That is, at the stage where the temperature measurement wafer W' is mounted on the electrostatic chuck 6, the temperatures of the temperature measurement wafer W' and the electrostatic chuck 6 are different.

Subsequently, the calculation unit 203 begins temperature measurements of the temperature measurement wafer W' and the electrostatic chuck 6 in each division region 60 by starting acquisition of temperature information of the electrostatic chuck 6 in each division region 60 from the acquisition unit 202. Then, at a time t 1 shown in FIG. 7A to FIG. 7C, the calculation unit 203 instructs the heat transfer gas control unit 201 to start the supply of the heat transfer gas of a preset pressure. In the present exemplary embodiment, the calculation unit 203 instructs the heat transfer gas control unit 201 to set 5 Torr, 10 Torr or 20 Torr as the pressure of the heat transfer gas. The heat transfer gas control unit 201 then instructs the heat transfer gas control unit 31 to supply, for each division region 60, the heat transfer gas of the pressure designated by the calculation unit 203. Accordingly, in each division region 60, the heat transfer gas is supplied into a gap between the top surface of the electrostatic chuck 6 and the rear surface of the temperature measurement wafer W' at the time $t_1$, so that heat exchange between the temperature measurement wafer W' and the electrostatic chuck 6 through the heat transfer gas is begun. Through this heat exchange between the temperature measurement wafer W' and the electrostatic chuck 6, the temperature of the temperature measurement wafer W' is decreased, whereas the temperature of the electrostatic chuck 6 is increased, as shown in FIG. 7A to FIG. 7C, for example.

Then, the calculation unit 203 instructs the temperature control unit 205 to start the supply of the power to the heater 6c at a time $t_2$ upon the lapse of a preset time (e.g., about 10 seconds) from the time $t_1$. The temperature control unit 205 instructs the heater power supply 30 to start the supply of the power to the heaters 6c and feedback-controls the power supplied to the heaters 6c such that the temperature of each division region 60 reaches a target temperature (e.g., 60° C.). Accordingly, in each division region 60, the temperature of the electrostatic chuck 6 and the temperature of temperature measurement wafer W' gradually approach the target temperature, as shown in FIG. 7A to FIG. 7C, for example.

Subsequently, at a time $t_3$ when the temperatures of the electrostatic chuck 6 and the temperature measurement wafer W' are stabilized, the processing control unit 206 begins a control over the supply of the high frequency power or the processing gas based on the processing recipe used when creating the correction table 2040. By way of example, the processing control unit 206 instructs the high frequency power supply 12a and the high frequency power supply 12b to start the supply of the high frequency powers, and controls the valve V and the MFC 15a such that the processing gas of a preset flow rate is supplied into the processing chamber 1. As a result, plasma of the processing gas is generated within the processing chamber 1 of the processing apparatus 100. At this time, as shown in FIG. 7A to FIG. 7C, for example, the temperature of the temperature measurement wafer W' is increased due to the heat input from the plasma generated within the processing chamber 1. The heat input from the plasma is transferred to the electrostatic chuck 6 and is radiated from the electrostatic chuck 6. Since, however, there exists a thermal resistance between the temperature measurement wafer W' and the electrostatic chuck 6, there is generated a temperature difference between the temperature measurement wafer W' and the electrostatic chuck 6 due to the thermal resistance.

In the example of FIG. 7A where the pressure of the heat transfer gas is 5 Torr, the temperature of the temperature measurement wafer W' is increased up to, e.g., $T_a=74.4°$ C. due to the heat input from the plasma. Since the electrostatic chuck 6 is regulated to have a temperature of about 60° C. by the temperature control unit 205, a temperature difference $\Delta T_a$ between the electrostatic chuck 6 and the temperature measurement wafer W' whose temperature is increased due to the heat input from the plasma is 14.4° C. Further, in the example of FIG. 7B where the pressure of the heat transfer gas is 10 Torr, the temperature of the temperature measurement wafer W' is increased up to, e.g., $T_b=69.9°$ C. due to the heat input from the plasma. Thus, a temperature difference $\Delta T_b$ between the electrostatic chuck 6 and the temperature measurement wafer W' the temperature of which is increased due to the heat input from the plasma is 9.9° C. Further, in the example of FIG. 7C where the pressure of the heat transfer gas is 20 Torr, the temperature of the temperature measurement wafer W' is increased up to, e.g., $T_c=66.6°$ C. due to the heat input from the plasma. Thus, a temperature difference $\Delta T_c$ between the electrostatic chuck 6 and the temperature measurement wafer W' the temperature of which is increased due to the heat input from the plasma is 6.6° C.

In addition, at the time $t_3$, as frequencies and power levels of the high frequency powers supplied into the processing chamber 1 and as the kind and the flow rate of the processing gas, it is desirable to use the frequencies and the power levels of the high frequency powers and the kind and the flow rate of the processing gas specified in the processing recipe for processing the semiconductor wafer W. As a result, it is possible to measure the temperature of the temperature measurement wafer W' in a processing environment where the semiconductor wafer W is actually processed.

The calculation unit 203 instructs the processing control unit 206 to stop the performing of the processing recipe. Accordingly, the generation of the plasma within the processing chamber 1 is stopped. Further, the calculation unit 203 instructs the temperature control unit 205 to stop the supply of the power to the heater 6c or to maintain the power supplied to the heater 6c to be constant, and instructs the heat transfer gas control unit 201 to stop the supply of the heat transfer gas. Accordingly, the temperature of the temperature measurement wafer W' mounted on the electrostatic chuck 6 is gradually returned to the room temperature (e.g., 30° C.), and the temperature of the electrostatic chuck 6 is gradually returned to the temperature (e.g., 10° C.) lower than the room temperature by the chiller unit 33.

The calculation unit 203 measures the temperature variations of the temperature measurement wafer W' and the electrostatic chuck 6 by performing the above-described process on each division region with the heat transfer gas of each pressure. Further, With respect to the heat transfer gas of each pressure, the calculation unit 203 calculates, for each division region, a gradient of the temperature variation of the electrostatic chuck 6 between the time $t_1$ and the time $t_2$ from the measurement data of the temperature variation. Here, a method of calculating the gradient of the temperature variation of the electrostatic chuck 6 will be described with reference to FIG. 8A to FIG. 8C.

Figure 8A:
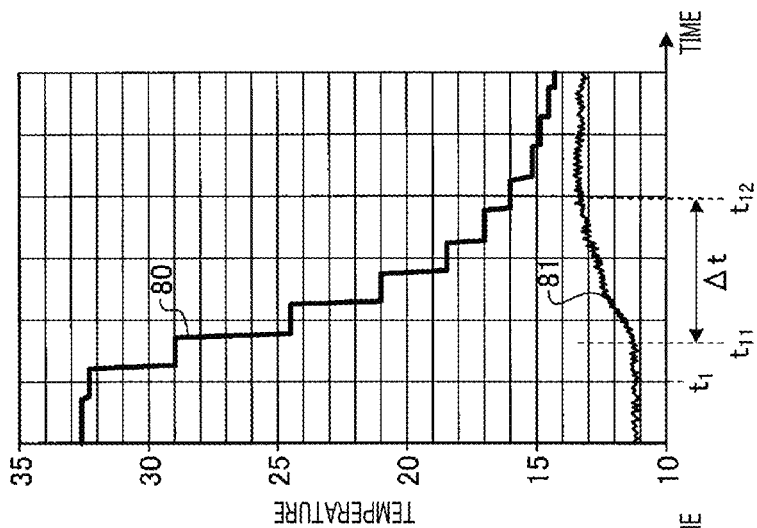
FIG. 8A to FIG. 8C are enlarged views illustrating the examples of the temperature variations of the temperature measurement wafer and the electrostatic chuck in creating the correction table.
Figure 8B:
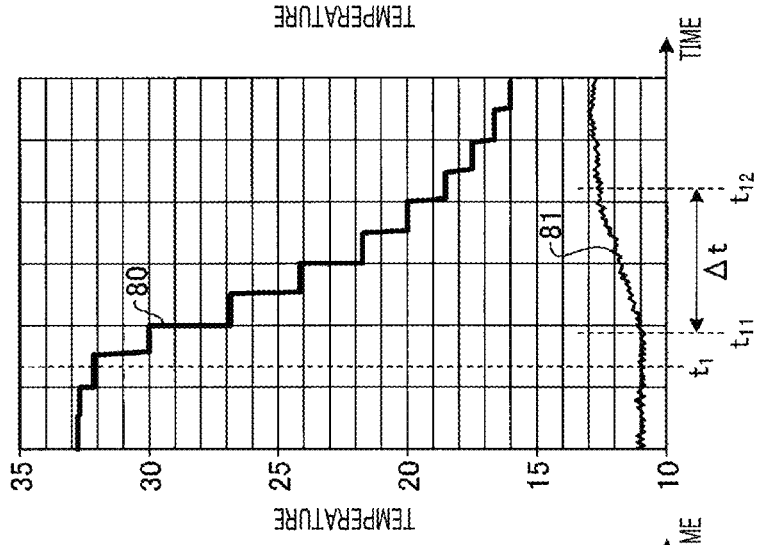
Figure 8C:
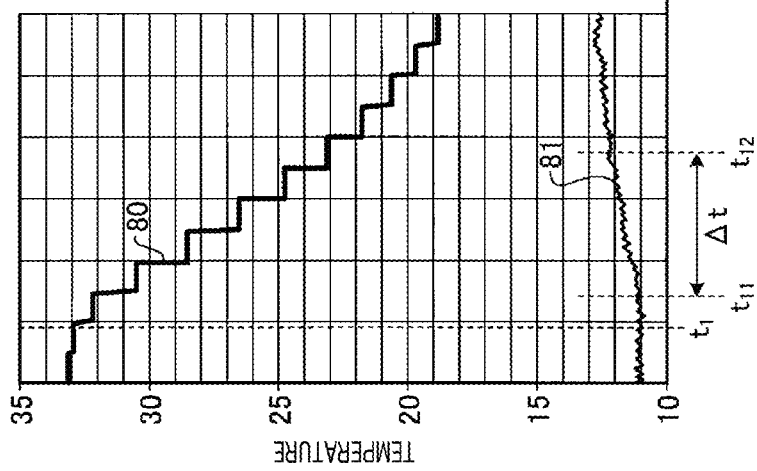

FIG. 8A to FIG. 8C are enlarged views illustrating the examples of the temperature variations of the temperature measurement wafer W' and the electrostatic chuck 6 when creating the correction table. FIG. 8A to FIG. 8C shows the examples of the temperature variations of the temperature measurement wafer W' and the electrostatic chuck 6 at a region corresponding to one division region (e.g., center region) on the electrostatic chuck 6. FIG. 8A is an enlarged view of graphs near the time $t_1$ in FIG. 7A; FIG. 8B, an enlarged view of graphs near the time $t_1$ in FIG. 7B; and FIG. 8C, an enlarged view of graphs near the time $t_1$ in FIG. 7C.

The calculation unit 203 measures the gradient of the temperature variation of the electrostatic chuck 6 in a period between a time $t_{11}$ upon the lapse of a first time from the time $t_1$ when the supply of the heat transfer gas is begun and a time $t_{12}$ upon the lapse of a second time $\Delta t$ from the time $t_{11}$, as illustrated in FIG. 8A to FIG. 8C, for example. In the present exemplary embodiment, the first time is, e.g., 1 second, and the second time $\Delta t$ is, e.g., 5 seconds. As depicted in FIG. 8A to FIG. 8C, the gradient of the temperature variation of the electrostatic chuck 6 from the time $t_{11}$ to the time $t_{12}$ varies depending on the pressure of the heat transfer gas. It is because the thermal resistance between the temperature measurement wafer W' and the electrostatic chuck 6 varies depending on the pressure of the heat transfer gas.

Figure 9:
FIG. 9 is a diagram illustrating examples of data regarding the temperature of the temperature measurement wafer and a gradient of the temperature variation of the electrostatic chuck with respect to different pressures of a heat transfer gas.

With respect to each pressure of the heat transfer gas, the calculation unit 203 acquires, from the measurement data of the temperature variation, the temperatures (for example, $T_a$, $T_b$ and $T_c$ shown in FIG. 7A to FIG. 7C) of the temperature measurement wafer W' during the plasma generation for each division region. FIG. 9 is a diagram illustrating examples of the data 62 in which the gradient of the temperature variation of the electrostatic chuck 6 and the temperature of the temperature measurement wafer W' is provided for each pressure of the heat transfer gas. As depicted in the data 62 of FIG. 9, for example, the calculation unit 203 calculates, for each pressure of the heat transfer gas, the gradient of the temperature variation of the electrostatic chuck 6 in each division region 60, and acquires the temperature of the temperature measurement wafer W' during the plasma generation. Further, for each division region, the calculation unit 203 calculates a correction value T off for each pressure of the heat transfer gas based on the following expression (1), for example.

$$T_{\mathit{off}} = T_r - T_m \qquad (1)$$

Here, $T_m$ denotes the temperature of the temperature measurement wafer W' during the plasma generation, and $T_r$ represents a reference temperature.

In the present exemplary embodiment, for example, the temperature $T_m$ of the temperature measurement wafer W' in case that the pressure of the heat transfer gas is 10 Torr is set as the reference temperature $T_r$. Thus, in the data 62 shown in FIG. 9, the reference temperature $T_r$ is 69.9° C. at the center region, and the reference temperature $T_r$ is 72.2° C. at the edge region. In the data 62 of FIG. 9, for example, when the pressure of the heat transfer gas is 5 Torr, the temperature $T_m$ of the temperature measurement wafer W' at the center region is 74.4° C. Thus, the calculation unit 203 calculates a value of 69.9−74.4=−4.5 as the correction value $T_{\mathit{off}}$ at the center region for the case where the pressure of the heat transfer gas is 5 Torr. Likewise, in the data 62 of FIG. 9, for example, when the pressure of the heat transfer gas is 20 Torr, the temperature $T_m$ of the temperature measurement wafer W' at the center region is 66.6° C. Thus, the calculation unit 203 calculates a value of 69.9−66.6=+3.3 as the correction value $T_{\mathit{off}}$ at the center region for the case where the pressure of the heat transfer gas is 20 Torr.

The calculation unit 203 creates, for each division region, the individual table 2041 (see FIG. 6) in which the gradient of the temperature variation of the electrostatic chuck 6 corresponds to the correction value $T_{\mathit{off}}$ for each pressure of the heat transfer gas. Then, the calculation unit 203 stores the correction table 2040 including the created individual table 2041 in the storage unit 204.

Here, the thermal resistance between the temperature measurement wafer W' and the electrostatic chuck 6 can be estimated from the gradient of the temperature variation of each of the temperature measurement wafer W' and the electrostatic chuck 6 in case that the heat is exchanged between the temperature measurement wafer W' and the electrostatic chuck 6 having a preset temperature difference. For example, in case that the thermal resistance between the temperature measurement wafer W' and the electrostatic chuck 6 is low, the gradient of the temperature variation of the electrostatic chuck 6 increases. On the other hand, in case that the thermal resistance between the temperature measurement wafer W' and the electrostatic chuck 6 is high, the gradient of the temperature variation of the electrostatic chuck 6 decreases. Further, in case that the thermal resistance between the temperature measurement wafer W' and the electrostatic chuck 6 is high, the temperature difference between the temperature measurement wafer W' and the electrostatic chuck 6 during the plasma generation is increased, whereas in case that the thermal resistance between the temperature measurement wafer W' and the electrostatic chuck 6 is low, the temperature difference between the temperature measurement wafer W' and the electrostatic chuck 6 during the plasma generation is decreased.

In consideration of the above, in the present exemplary embodiment, in case that the thermal resistance between the temperature measurement wafer W' and the electrostatic chuck 6 is high, that is, in case that the gradient of the temperature variation of the electrostatic chuck 6 is small, a correction value for decreasing the target temperature of the electrostatic chuck 6 is calculated. Meanwhile, in case that the thermal resistance between the temperature measurement wafer W' and the electrostatic chuck 6 is low, that is, in case that the gradient of the temperature variation of the electrostatic chuck 6 is large, a correction value for increasing the target temperature of the electrostatic chuck 6 is calculated. Further, a difference between the temperature of the temperature measurement wafer W' measured during the plasma generation and the reference temperature is set to be a magnitude of the correction value. When processing the semiconductor wafer W, the temperature variation of the electrostatic chuck 6 on which the semiconductor wafer W is mounted is measured, and the correction value corresponding to the gradient of the temperature variation of the electrostatic chuck 6 is applied to the target temperature of the electrostatic chuck 6 at the time of performing the plasma process on the semiconductor wafer W. Accordingly, it is possible to suppress the temperature of the semiconductor wafer W from being changed for the multiple semiconductor wafers W during the plasma process due to the variation in the thermal resistance between the semiconductor wafer W and the electrostatic chuck 6.

<Correction in Processing Semiconductor Wafer W>

Figures 10A, 10B, 10C:
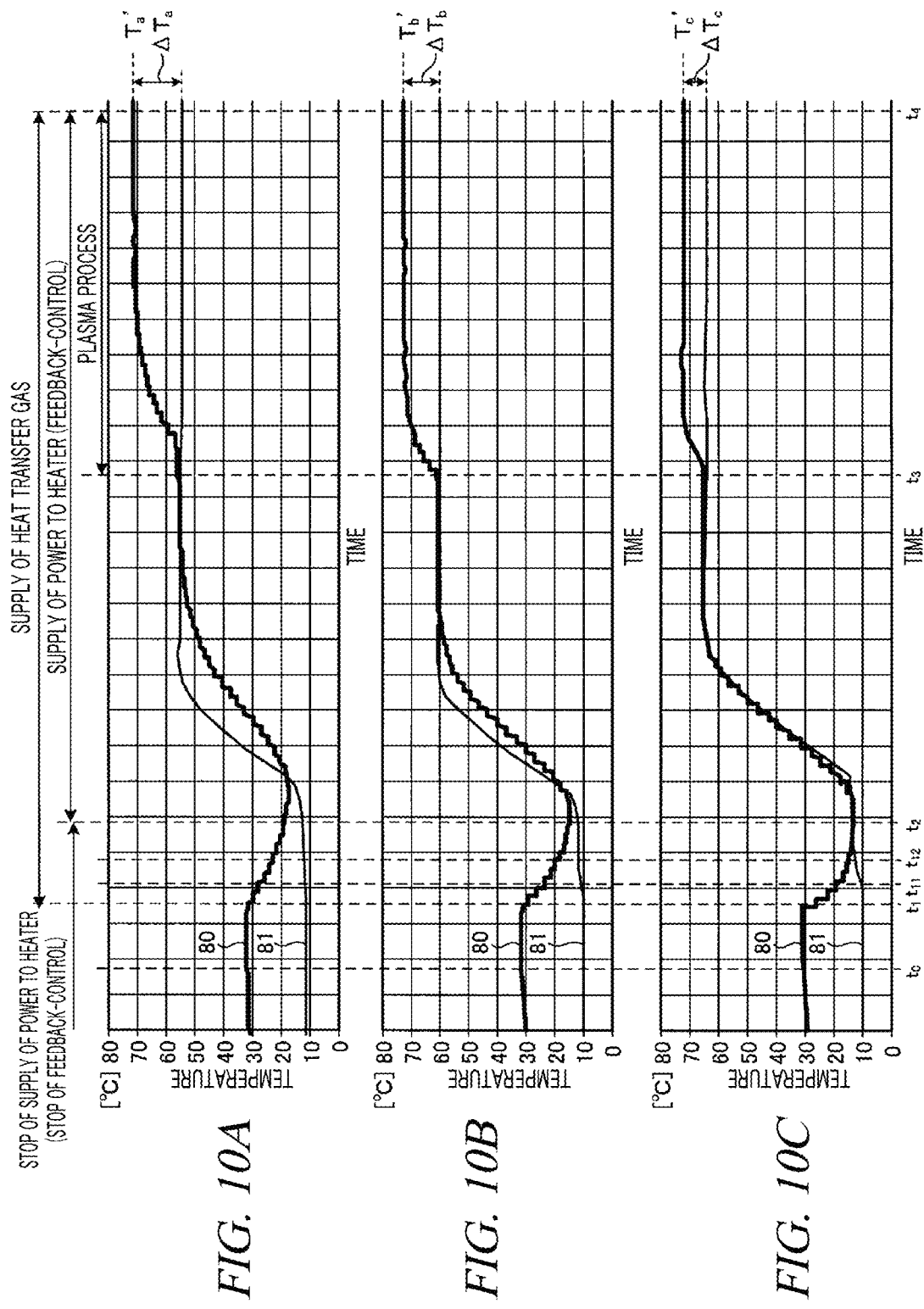
FIG. 10A to FIG. 10C are diagrams illustrating examples of the temperature variations of the temperature measurement wafer and the electrostatic chuck when correction values are applied.

FIG. 10A to FIG. 10C are diagrams illustrating examples of the temperature variations of the temperature measurement wafer W' and the electrostatic chuck 6 in case that the correction values are applied. FIG. 10A to FIG. 10C illustrate examples of the temperature variations of the temperature measurement wafer W' and the electrostatic chuck 6 at a region corresponding to one division region (e.g., center region) on the electrostatic chuck 6. FIG. 10A illustrates an example of the temperature variations of the temperature measurement wafer W' and the electrostatic chuck 6 when the pressure of the heat transfer gas is 5 Torr; FIG. 10B, when the pressure of the heat transfer gas is 10 Torr; and FIG. 10C, when the pressure of the heat transfer gas is 20 Torr.

Here, as the number of the semiconductor wafers W processed by the processing apparatus 100 increases, that is, as the total processing time in the processing apparatus 100 increases, the variation in the thermal resistance between the semiconductor wafer W and the electrostatic chuck 6 increases due to a change in the environment within the processing chamber 1. By way of example, when a process of depositing a preset film on multiple semiconductor wafers W is performed, an adhesion amount of deposits increases as the total processing time increases, so that the thermal resistance between the semiconductor wafer W and the electrostatic chuck 6 is decreased. The thermal resistance between the semiconductor wafer W and the electrostatic chuck 6 can be controlled by adjusting the pressure of the heat transfer gas supplied into the gap between the semiconductor wafer W and the electrostatic chuck 6. Thus, in FIG. 10A to FIG. 10C, the variation in the thermal resistance between the semiconductor wafer W and the electrostatic chuck 6 is simulated while varying the pressure of the heat transfer gas.

The thermal resistance between the semiconductor wafer W and the electrostatic chuck 6 when the pressure of the heat transfer gas is 5 Torr (FIG. 10A) corresponds to a thermal resistance when the total processing time upon the semiconductor wafers W is, for example, zero (0), that is, a thermal resistance between an unused electrostatic chuck 6 and the semiconductor wafer W. Further, the thermal resistance between the semiconductor wafer W and the electrostatic chuck 6 when the pressure of the heat transfer gas is 10 Torr (FIG. 10B) corresponds to a thermal resistance between the electrostatic chuck 6 and the semiconductor wafer W when the total processing time upon the semiconductor wafers W is, for example, 30 hours. Furthermore, the thermal resistance between the semiconductor wafer W and the electrostatic chuck 6 when the pressure of the heat transfer gas is 20 Torr (FIG. 10C) corresponds to a thermal resistance between the electrostatic chuck 6 and the semiconductor wafer W when the total processing time upon the semiconductor wafers W is, for example, 60 hours. In addition, in FIG. 10A to FIG. 10C, the temperature measurement wafer W' in order to monitor the temperature of the wafer is used, and the same temperature variation as shown in FIG. 10A to FIG. 10C takes place when processing the semiconductor wafer W. Thus, in the following, description will be provided in case of processing the semiconductor wafer W.

In processing the semiconductor wafer W, the calculation unit 203 first instructs the temperature control unit 205 to start cooling of the electrostatic chuck 6 and to stop the supply of the power to the heater 6c or maintain the power supplied to the heater 6c to be constant. Accordingly, the electrostatic chuck 6 is cooled through the base 2a which is cooled by the coolant circulated within the flow path 2b of the base 2a. Further, the calculation unit 203 instructs the processing control unit 206 to perform the processing recipe for the semiconductor wafer W. Based on the processing recipe, the processing control unit 206 sends the instruction indicating the target temperature of the electrostatic chuck 6 in processing the semiconductor wafer W to the temperature control unit 205. Then, the calculation unit 203 instructs the non-illustrated transfer robot to carry a semiconductor wafer W into the processing chamber 1 and mount the semiconductor wafer W on the electrostatic chuck 6. At the time to when the semiconductor wafer W is mounted on the electrostatic chuck 6, the semiconductor wafer W is kept to have a room temperature (e.g., 30° C.) and the electrostatic chuck 6 is cooled to have a temperature (e.g., 10° C.) lower than the room temperature.

Subsequently, the calculation unit 203 begins temperature measurement of the electrostatic chuck 6 in each division region 60 by starting acquisition of temperature information of the electrostatic chuck 6 in each division region 60 from the acquisition unit 202. Then, at the time $t_1$ shown in FIG. 10A to FIG. 10C, the calculation unit 203 instructs the heat transfer gas control unit 201 to start the supply of the heat transfer gas having a pressure specified in the processing recipe of the semiconductor wafer W. Accordingly, for each division region 60, the heat transfer gas is supplied into the gap between the top surface of the electrostatic chuck 6 and the rear surface of the semiconductor wafer W at the time $t_1$, so that the heat exchange between the semiconductor wafer W and the electrostatic chuck 6 through the heat transfer gas is begun. Through this heat exchange between the semiconductor wafer W and the electrostatic chuck 6, the temperature of the semiconductor wafer W is decreased, whereas the temperature of the electrostatic chuck 6 is increased, as shown in FIG. 10A to FIG. 10C, for example.

Then, the calculation unit 203 measures, in each division region 60, a gradient of a temperature variation of the electrostatic chuck 6 in a period between the time $t_{11}$ upon the lapse of the first time from the time $t_1$ when the supply of the heat transfer gas is begun and the time $t_{12}$ upon the lapse of the second time from the time $t_{11}$. Further, the calculation unit 203 refers to the individual table 2041 for each division region 60 in the storage unit 204 and acquires the correction value corresponding to the gradient of the measured temperature variation of the electrostatic chuck 6. For example, in the present exemplary embodiment, for each division region 60, the calculation unit 203 selects, from the individual table 2041, the gradient which is closest to the gradient of the measured temperature variation of the electrostatic chuck 6 and acquires the correction value corresponding to the selected gradient. As another example, the calculation unit 203 may calculate a fitting curve which approximates a relationship between the gradient and the correction value in the individual table 2041 and acquire the correction value on the fitting curve corresponding to the gradient of the measured temperature variation of the electrostatic chuck 6.

The calculation unit 203 outputs the correction value acquired for each division region 60 to the temperature control unit 205. Then, at the time $t_2$ upon the lapse of a preset time from the time $t_1$, the calculation unit 203 instructs the temperature control unit 205 to start the supply of the power to the heater 6c. For each division region 60, the temperature control unit 205 corrects the target temperature by adding the correction value obtained from the calculation unit 203 to the target temperature instructed from the processing control unit 206. Then, the temperature control unit 205 feedback-controls the power of the heater 6c such that the temperature of the electrostatic chuck 6 reaches the corrected target temperature in each division region 60. Accordingly, the electrostatic chuck 6 is controlled to have the target temperature to which the correction value according to the temperature variation of the electrostatic chuck 6 in a period from the time $t_1$ when the supply of the heat transfer gas is begun to the time $t_2$ when the supply of the power to the heater 6c is begun is applied. Further, when the correction value for each division region 60 is output from the calculation unit 203, without waiting until the time $t_2$, the temperature control unit 205 may feedback-control the power of the heater 6c such that the temperature of the electrostatic chuck 6 reaches the target temperature which is corrected by the correction value designated by the calculation unit 203.

At the time $t_3$ when the temperatures of the electrostatic chuck 6 and the semiconductor wafer W are stabilized, the processing control unit 206 begins the control over the supply of the processing gas or the high frequency power according to the processing recipe for the semiconductor wafer W. Accordingly, the plasma of the processing gas is generated within the processing chamber 1, and a preset process is performed on the semiconductor wafer W by the plasma. At this time, the temperature of the semiconductor wafer W is increased due to the heat input from the plasma.

Here, in the example of FIG. 10A where the pressure of the heat transfer gas is 5 Torr, the gradient of the temperature variation of the electrostatic chuck 6 at the center region before the beginning of the supply of the power to the heater 6c is 0.23. Accordingly, in case that the correction table 2040 shown in FIG. 6 is stored in the storage unit 204, the calculation unit 203 acquires a value of, e.g., −4.5 as the correction value. Further, when the target temperature is 60° C., the temperature control unit 205 acquires a value of 55.5° C. as the corrected target temperature and feedback-controls the power of the heater 6c such that the temperature of the center region of the electrostatic chuck 6 reaches 55.5° C. Since the temperature difference $\Delta T_a$ between the semiconductor wafer W and the electrostatic chuck 6 when the pressure of the heat transfer gas is 5 Torr is 14.4° C. as explained in FIG. 7A, the temperature $T_a'$ of the semiconductor wafer W during the plasma process is controlled to about 70° C.

Further, in the example of FIG. 10B where the pressure of the heat transfer gas is 10 Torr, the gradient of the temperature variation of the electrostatic chuck 6 at the center region before the beginning of the supply of the power to the heater 6c is 0.33. Accordingly, in case that the correction table 2040 shown in FIG. 6 is stored in the storage unit 204, the calculation unit 203 acquires a value of, e.g., zero (0) as the correction value. Further, when the target temperature is 60° C., the temperature control unit 205 acquires a value of 60° C. as the corrected target temperature and feedback-controls the power of the heater 6c such that the temperature of the center region of the electrostatic chuck 6 reaches 60° C. Since the temperature difference $\Delta T_b$ between the semiconductor wafer W and the electrostatic chuck 6 when the pressure of the heat transfer gas is 10 Torr is 9.9° C. as explained in FIG. 7B, the temperature $T_b'$ of the semiconductor wafer W during the plasma process is controlled to about 70° C.

Furthermore, in the example of FIG. 10C where the pressure of the heat transfer gas is 20 Torr, the gradient of the temperature variation of the electrostatic chuck 6 at the center region before the beginning of the supply of the power to the heater 6c is 0.42. Accordingly, in case that the correction table 2040 illustrated in FIG. 6 is stored in the storage unit 204, the calculation unit 203 acquires a value of, e.g., +3.3 as the correction value. Further, when the target temperature is 60° C., the temperature control unit 205 acquires a value of 63.3° C. as the corrected target temperature and feedback-controls the power of the heater 6c such that the temperature of the center region of the electrostatic chuck 6 reaches 63.3° C. Since the temperature difference $\Delta T_c$ between the semiconductor wafer W and the electrostatic chuck 6 when the pressure of the heat transfer gas is 20 Torr is 6.6° C. as explained in FIG. 7C, the temperature $T_c'$ of the semiconductor wafer W during the plasma process is controlled to about 70° C.

As stated above, the temperature sensor 20 feedback-controls the power supplied to the heater 6c such that the target temperature of the electrostatic chuck 6 is decreased when the thermal resistance between the semiconductor wafer W and the electrostatic chuck 6 is high, that is, when the gradient of the temperature variation of the electrostatic chuck 6 is small and such that the target temperature of the electrostatic chuck 6 is increased when the thermal resistance between the semiconductor wafer W and the electrostatic chuck 6 is small, that is, when the gradient of the temperature variation of the electrostatic chuck 6 is large. Accordingly, even in case that the thermal resistance between the semiconductor wafer W and the electrostatic chuck 6 is changed in the course of processing multiple semiconductor wafers W, it is possible to suppress the temperature of the semiconductor wafer W from becoming non-uniform between the multiple semiconductor wafers W.

<Process Flow for Creating Correction Table 2040>

Figure 11:
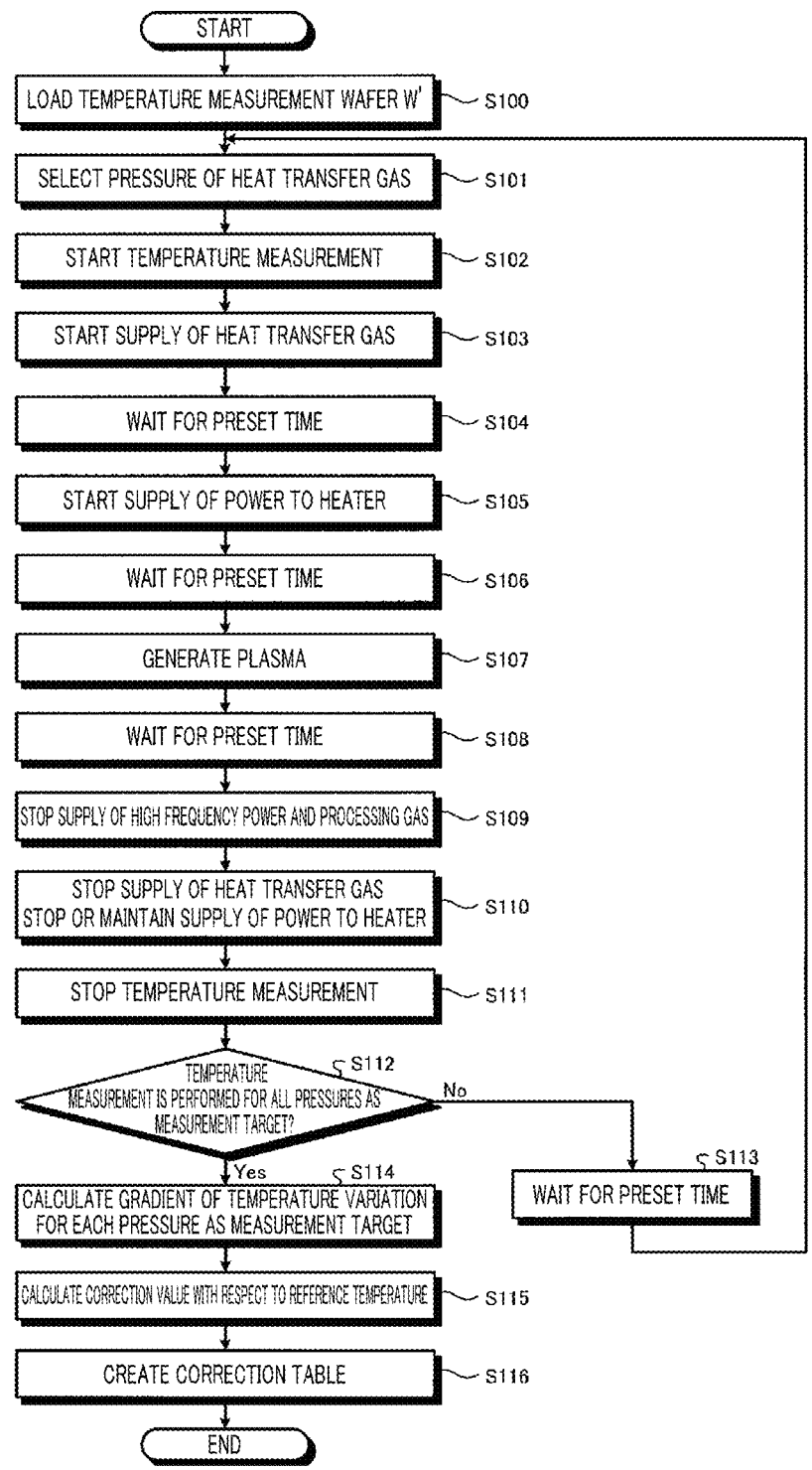
FIG. 11 is a flowchart for describing an example of a process of creating the correction table according to the first exemplary embodiment.

FIG. 11 is a flowchart illustrating an example of a process of creating the correction table according to the first exemplary embodiment. Prior to performing the process shown in FIG. 11, the heater power supply 30 stops or maintains the supply of the power to the heater 6c, and the electrostatic chuck 6 is cooled to have a preset temperature by the coolant which is circulated within the base 2a. Further, the temperature measurement wafer W' has a room temperature.

First, the calculation unit 203 instructs the non-illustrated transfer robot to carry the temperature measurement wafer W' into the processing chamber 1 and mount the temperature measurement wafer W' on the electrostatic chuck 6 (S100). Then, the calculation unit 203 selects, for each division region 60, the pressure of the heat transfer gas supplied into the gap between the temperature measurement wafer W' and the electrostatic chuck 6 (S101). In the present exemplary embodiment, the calculation unit 203 selects 5 Torr, 10 Torr and 20 Torr as the pressure of the heat transfer gas in sequence.

Subsequently, the calculation unit 203 starts acquisition of the temperature information of the electrostatic chuck 6 in each division region 60 from the acquisition unit 202 (S102).

Then, the calculation unit 203 instructs the heat transfer gas control unit 201 to start the supply of the heat transfer gas of the pressure which is selected for each division region 60 in the process S101. Accordingly, the supply of the heat transfer gas into the gap between the temperature measurement wafer W' and the electrostatic chuck 6 is begun for each division region 60 (S103). Thus, the heat exchange between the temperature measurement wafer W' and the electrostatic chuck 6 through the heat transfer gas is begun.

Thereafter, the calculation unit 203 waits until a preset time (e.g., about 10 seconds) elapses from the beginning of the supply of the heat transfer gas (S104). Then, the calculation unit 203 instructs the temperature control unit 205 to start the supply of the power to the heater 6c, so that the power is supplied to the heater 6c from the heater power supply 30 (S105). Then, the temperature control unit 205 starts the feedback control over the power supplied to the heater 6c such that the temperature of the electrostatic chuck 6 reaches the target temperature.

Subsequently, the processing control unit 206 waits for a preset time period such that the temperature of the temperature measurement wafer W' is stabilized (S106). Then, the processing control unit 206 starts the control over the supply of the high frequency power or the supply of the processing gas based on the processing recipe for creating the correction table 2040, so that plasma of the processing gas is generated within the processing chamber 1 (S107).

Afterwards, the processing control unit 206 waits for a preset time period until the temperature of the temperature measurement wafer W' is stabilized (S108). Then, the processing control unit 206 stops the supply of the high frequency power and the supply of the processing gas (S109). Then, the calculation unit 203 instructs the heat transfer gas control unit 201 to stop the supply of the heat transfer gas and instructs the temperature control unit 205 to stop the supply of the power to the heaters 6c or to maintain the power supplied to the heaters 6c to be constant (S110). Then, the calculation unit 203 stops the acquisition of the temperature information of the electrostatic chuck 6 in each division region 60 (S111).

Thereafter, the calculation unit 203 determines whether the temperature measurement of the temperature measurement wafer W' and the electrostatic chuck 6 has been performed for all the pressures as the measurement targets (in the present exemplary embodiment, 5 Torr, 10 Torr and 20 Torr) (S112). If there is a pressure for which the temperature measurement of the temperature measurement wafer W' and the electrostatic chuck 6 is not performed (S112: No), the calculation unit 203 waits for a preset time period until the electrostatic chuck 6 is cooled to have a preset temperature by the chiller unit 33 and the temperature of the temperature measurement wafer W' is returned back to the room temperature (S113). Then, the calculation unit 203 performs the process S101 again.

Meanwhile, if it is determined that the temperature measurement of the temperature measurement wafer W' and the electrostatic chuck 6 has been performed for all the pressures (S112: Yes), the calculation unit 203 calculates the gradient of the temperature variation of the electrostatic chuck 6 in a period between the time $t_{11}$ upon the lapse of the first time from the a time $t_1$ when the supply of the heat transfer gas is begun and the time $t_{12}$ upon the lapse of the second time $\Delta t$ from the time $t_{11}$ with respect to each pressure of the heat transfer gas for each division region 60 (S114), as explained above with reference to FIG. 8A to FIG. 8C.

Then, with respect to each division region 60, the calculation unit 203 calculates the correction value T off with respect to the reference temperature based on the aforementioned expression (1) for each pressure of the heat transfer gas (S115). Then, with respect to each division region 60, the calculation unit 203 creates the individual table 2041 (see FIG. 6) in which the gradient of the temperature variation of the electrostatic chuck 6 corresponds to the correction value T off for each pressure of the heat transfer gas, and stores the correction table 2040 including the created individual table 2041 in the storage unit 204 (S116).

<Process Flow for Processing Semiconductor Wafer W>

Figure 12:
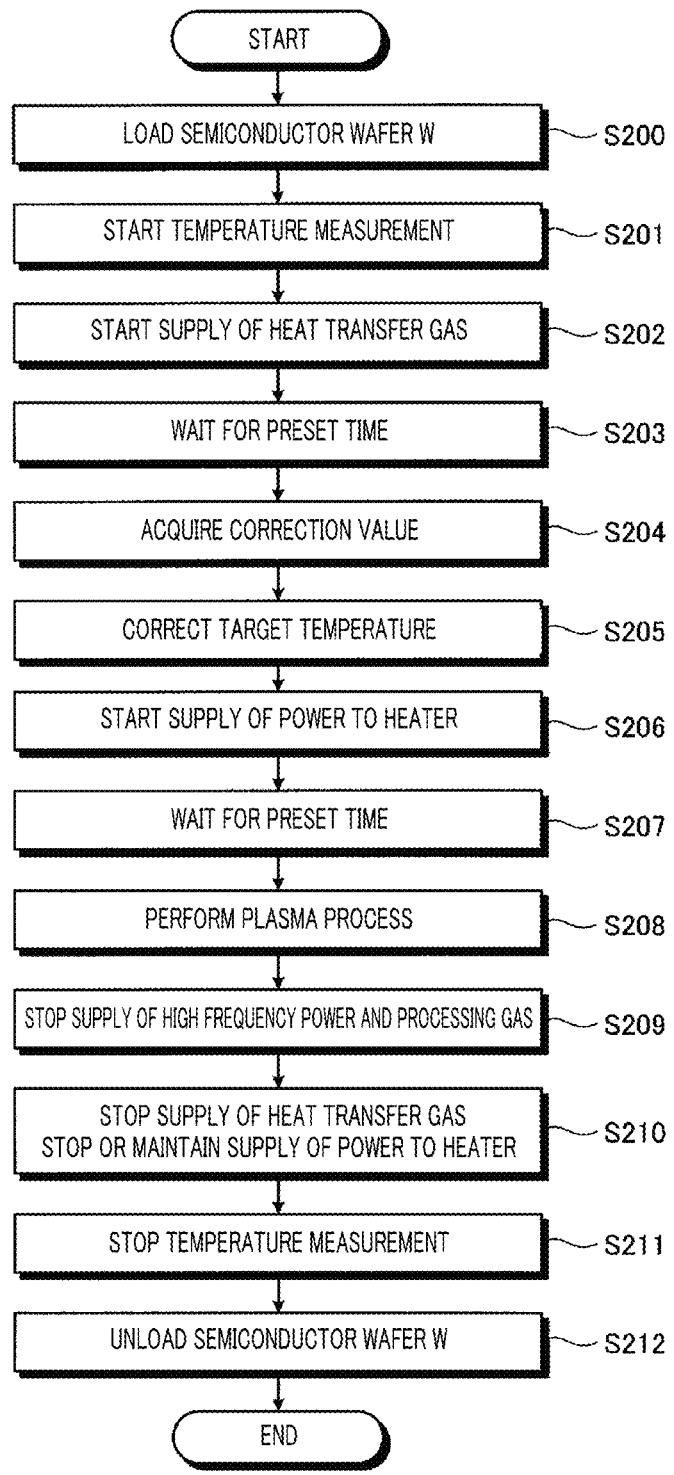
FIG. 12 is a flowchart for describing an example of a process of processing a semiconductor wafer W according to the first exemplary embodiment.

FIG. 12 is a flowchart illustrating an example of a process of processing a semiconductor wafer W according to the first exemplary embodiment. Prior to performing the process of FIG. 12, the heater power supply 30 stops or maintains the supply of the power to the heater 6c, and the electrostatic chuck 6 is cooled to have a preset temperature by a coolant which is circulated within the base 2a. Further, the semiconductor wafer W has a room temperature.

First, the calculation unit 203 instructs the non-illustrated transfer robot to carry the semiconductor wafer W into the processing chamber 1 and mount the semiconductor wafer W on the electrostatic chuck 6 (S200). Then, the calculation unit 203 starts acquisition of temperature information of the electrostatic chuck 6 in each division region 60 from the acquisition unit 202 (S201).

Then, the calculation unit 203 instructs the heat transfer gas control unit 201 to start the supply of the heat transfer gas of a preset pressure into the gap between the semiconductor wafer W and the electrostatic chuck 6 in each division region 60 according to a processing recipe in which the processing upon the semiconductor wafer W is defined. Accordingly, the supply of the heat transfer gas into the gap between the semiconductor wafer W and the electrostatic chuck 6 is begun in each division region 60 (S202). Thus, the heat exchange between the semiconductor wafer W and the electrostatic chuck 6 through the heat transfer gas is begun.

Subsequently, the calculation unit 203 waits until a preset time (e.g., about 10 seconds) elapses from the beginning of the supply of the heat transfer gas (S203). Then, the calculation unit 203 calculates, for each division region 60, a gradient of the temperature variation of the electrostatic chuck 6 in a period between the time $t_{11}$ upon the lapse of the first time from the time $t_1$ when the supply of the heat transfer gas is begun and the time $t_{12}$ upon the lapse of the second time $\Delta t$ from the time $t_{11}$, and the calculation unit 203 acquires, for each division region 60, the correction value corresponding to the calculated gradient from the correction table 2040 within the storage unit 204 (S204). Then, the calculation unit 203 instructs the temperature control unit 205 to start the supply of the power to the heaters 6c, and outputs the acquired correction value for each division region 60 to the temperature control unit 205.

The temperature control unit 205 corrects, for each division region 60, the target temperature instructed from the processing control unit 206 by adding the correction value output from the calculation unit 203 to the target temperature (S205). Then, the temperature control unit 205 starts the supply of the power to the heater 6c and feedback-controls, for each division region 60, the power supplied to the heaters 6c such that the temperature of the electrostatic chuck 6 reaches the corrected target temperature (S206).

Thereafter, the processing control unit 206 waits for a preset time period until the temperature of the semiconductor wafer W is stabilized (S207). Then, the processing control unit 206 performs a plasma process by starting the control over the supply of the high frequency power and the supply of the processing gas according to the processing recipe in which the processing upon the semiconductor wafer W is defined (S208). Upon the completion of the plasma process, the processing control unit 206 stops the supply of the high frequency power and the supply of the processing gas (S209). Then, the calculation unit 203 instructs the heat transfer gas control unit 201 to stop the supply of the heat transfer gas, and instructs the temperature control unit 205 to stop the supply of the power to the heaters 6c or to maintain the power supplied to the heaters 6c to be constant (S210). Then, the calculation unit 203 stops the acquisition of the temperature information of the electrostatic chuck 6 for each division region 60 (S211). Thereafter, the calculation unit 203 instructs the non-illustrated transfer robot to carry the semiconductor wafer W out of the processing chamber 1 (S212).

As stated above, the first exemplary embodiment has been described. As clearly seen from the above description, in the processing system 10 according to the first exemplary embodiment, the non-uniformity in the temperature during the plasma process can be suppressed between multiple semiconductor wafers W even in case that the thermal resistance between the semiconductor wafers W and the electrostatic chuck 6 is changed in the course of processing the multiple semiconductor wafers W.

Second Exemplary Embodiment

In the first exemplary embodiment described above, the target temperature of the electrostatic chuck 6 is corrected for each division region 60 based on the thermal resistance between the semiconductor wafer W and the electrostatic chuck 6 in each division region 60. Meanwhile, according to a second exemplary embodiment, the temperature variation of the semiconductor wafer W caused by the change of the thermal resistance between the semiconductor wafer W and the electrostatic chuck 6 is suppressed by controlling the pressure of the heat transfer gas supplied into the gap between the semiconductor wafer W and the electrostatic chuck 6 in each division region 60 based on the thermal resistance between the semiconductor wafer W and the electrostatic chuck 6. The second exemplary embodiment especially has an advantage when it is applied to a processing system 10 in which the target temperature of the electrostatic chuck 6 is maintained to be constant or a processing system 10 in which the heater 6c is not provided within the electrostatic chuck 6. Further, since a processing system 10, a processing apparatus 100 and a control apparatus 200 are the same as the processing system 10, the processing apparatus 100 and the control apparatus 200 of the first exemplary embodiment described above with reference to FIG. 1 to FIG. 5 except the following, redundant description thereof will be omitted.

Figures 13, 14:
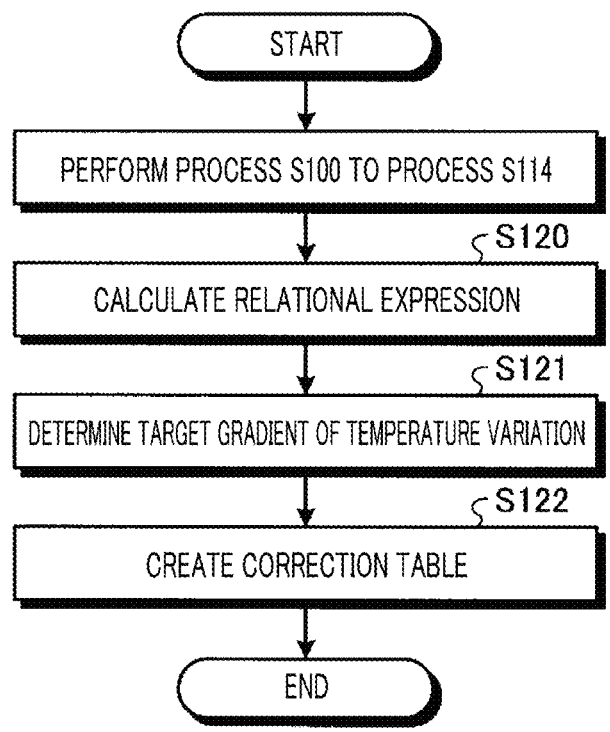
FIG. 13 is a diagram illustrating an example of a correction table according to a second exemplary embodiment.
FIG. 14 is a flowchart for describing an example of a process of creating the correction table according to the second exemplary embodiment.

In the present exemplary embodiment, the storage unit 204 stores a correction table 2043 as illustrated in FIG. 13, for example. FIG. 13 is a diagram illustrating an example of the correction table 2043 according to the second exemplary embodiment. A relational expression and a target value of the gradient for each of division regions (center region and edge region) are stored in the correction table 2043, as depicted in FIG. 13, for example. Here, the relational expression refers to an approximate expression indicating a variation tendency of the gradient of the temperature variation of the electrostatic chuck 6 when the pressure of the heat transfer gas is changed. The target value of the gradient refers to a target gradient in the temperature variation of the electrostatic chuck 6. The target gradient may be, for example, a gradient which is obtained when determining a processing condition of a process. Further, in the relational expression shown in FIG. 13, x denotes the pressure of the heat transfer gas, and y represents the gradient of the temperature variation of the electrostatic chuck 6.

<Process Flow for Creating Correction Table 2043>

FIG. 14 is a flowchart illustrating an example of a process of creating the correction table 2043 according to the second exemplary embodiment. Except the following, this process is the same as the process of creating the correction table 2040 described in FIG. 11, and, thus, same reference numerals will be assigned and redundant description will be omitted.

Figure 15:
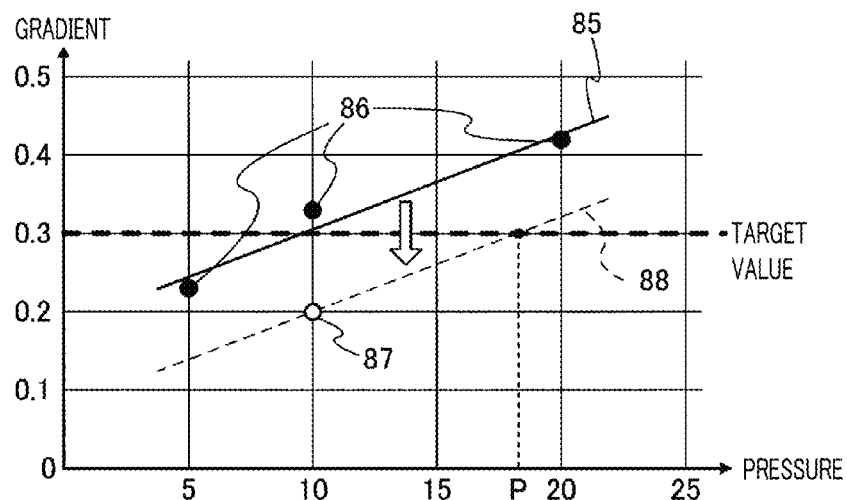
FIG. 15 is a diagram illustrating an example of a method of calculating a pressure of a heat transfer gas.

First, the control apparatus 200 performs the process S100 to the process S114 which are described in FIG. 11. With respect to each division region 60, the calculation unit 203 calculates the relational expression indicating the relation between the pressure of the heat transfer gas and the gradient of the temperature variation of the electrostatic chuck 6 for each pressure of the heat transfer gas (S120). By way of example, it is assumed that values marked by multiple dots 86 are calculated as the gradient of the temperature variation of the electrostatic chuck 6 for each pressure of the heat transfer gas, as illustrated in FIG. 15. In FIG. 15, a horizontal axis indicates the pressure of the heat transfer gas, and a vertical axis represents the gradient of the temperature variation of the electrostatic chuck 6.

The calculation unit 203 calculates a straight line 85 indicating a distribution tendency of the multiple dots 86 as the relational expression based on the distribution of the multiple dots 86. In the present exemplary embodiment, 'y=0.0121x+0.185' is calculated as the relational expression for the center region and 'y=0.0141x+0.155' is calculated as a relational expression for the edge region, as shown in FIG. 13, for example. Further, in the present exemplary embodiment, the relational expression is represented by the straight line. However, the relational expression may be represented by a curved line as long as it shows the distribution tendency of the multiple dots 86.

Subsequently, the calculation unit 203 determines the target value of the gradient of the temperature variation of the electrostatic chuck 6 (S121). For example, a reference gradient of the temperature variation of the electrostatic chuck 6 when the temperature of the semiconductor wafer W during the plasma process reaches a preset reference temperature is used as the target value of the gradient of the temperature variation of the electrostatic chuck 6. Further, the gradient of the temperature variation of the electrostatic chuck 6 is related to the thermal resistance between the semiconductor wafer W and the electrostatic chuck 6. Determining the target value of the gradient of the temperature variation of the electrostatic chuck 6 corresponds to determining a target value of the thermal resistance between the semiconductor wafer W and the electrostatic chuck 6. The thermal resistance between the semiconductor wafer W and the electrostatic chuck 6 can be controlled to some extent by adjusting the pressure of the heat transfer gas. Thus, it is desirable that the target value of the gradient of the temperature variation of the electrostatic chuck 6 is set to a value near the approximate middle of a range of the thermal resistance which can be controlled by using the pressure of the heat transfer gas. In the present exemplary embodiment, a value of, e.g., 0.3 is determined as the target value of the gradient of the temperature variation of the electrostatic chuck 6 for the center region and the edge region, as illustrated in FIG. 13.

The calculation unit 203 creates the correction table 2043 including the relational expression and the target value of the gradient of the temperature variation of the electrostatic chuck 6 which are calculated for each division region 60, and stores the created correction table 2043 in the storage unit 204 (S122).

<Process Flow for Processing Semiconductor Wafer W>

Figure 16:
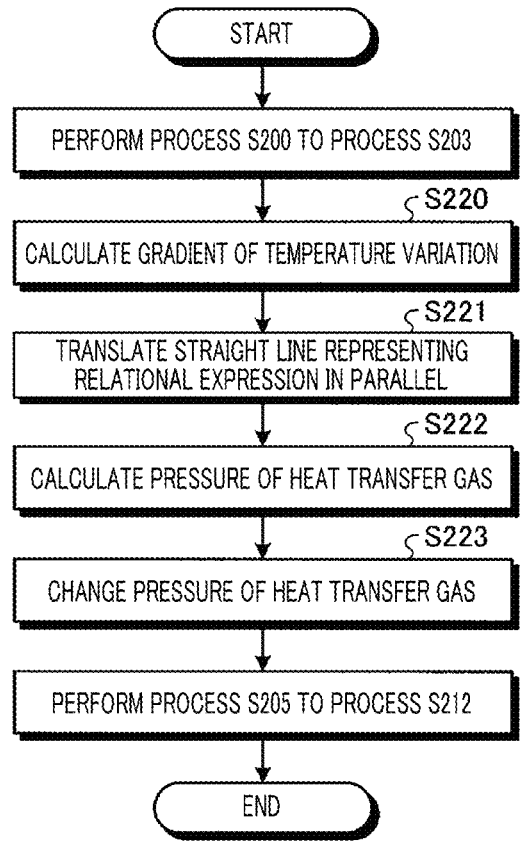
FIG. 16 is a flowchart for describing an example of a process of processing the semiconductor wafer W according to the second exemplary embodiment.

FIG. 16 is a flowchart illustrating an example of a process of processing a semiconductor wafer W according to the second exemplary embodiment. Except the following, this process is the same as the process of the semiconductor wafer W described in FIG. 12, and, thus, same reference numerals will be assigned and redundant description will be omitted.

First, the control apparatus 200 performs the process S200 to the process S203 which are described in FIG. 12. The calculation unit 203 calculates, for each division region 60, the gradient of the temperature variation of the electrostatic chuck 6 in a period between the time $t_{11}$ upon the lapse of the first time from the time $t_1$ when the supply of the heat transfer gas is begun and the time $t_{12}$ upon the lapse of the second time from the time $t_{11}$ (S220). Here, as shown in FIG. 15, for example, it is assumed that a value indicated by a dot 87 is calculated as the gradient of the temperature variation of the electrostatic chuck 6 in a certain division region 60.

Subsequently, the calculation unit 203 acquires the relational expression for each division region 60 from the correction table 2043. Then, for each division region 60, the calculation unit 203 translates the straight line indicated by the relational expression acquired from the correction table 2043 in parallel such that the straight line passes a point of the gradient value of the temperature variation calculated in the process S220 (S221). That is, as described in FIG. 15, for example, by translating the straight line 85 in parallel such that the straight line 85, which indicates the relational expression acquired from the correction table 2043, passes the dot 87 indicating the gradient value of the temperature variation obtained in the process S220, the calculation unit 203 acquires a straight line 88.

Thereafter, for each division region 60, the calculation unit 203 calculates, from the parallel-translated straight line, the pressure of the heat transfer gas which allows the gradient of the temperature variation of the electrostatic chuck 6 to become the target value (S222). By way of example, from the parallel-translated straight line 88, the calculation unit 203 calculates the pressure P of the heat transfer gas at which the gradient of the temperature variation of the electrostatic chuck 6 becomes the target value of 0.3, as illustrated in FIG. 15, for example. Then, the calculation unit 203 outputs the calculated pressure P for each division region 60 to the heat transfer gas control unit 201. The heat transfer gas control unit 201 then changes the pressure of the heat transfer gas in each division region such that the pressure of the heat transfer gas in each division region 60 becomes the pressure P calculated from the calculation unit 203. (S223). Then, the control apparatus 200 performs the process S205 to the process S212 which are described in FIG. 12.

In the above, the second exemplary embodiment has been described. As clearly seen from the above description, in the processing system 10 according to the second exemplary embodiment, the non-uniformity in the temperature during the plasma process can be suppressed between multiple semiconductor wafers W even in case that the thermal resistance between the semiconductor wafers W and the electrostatic chuck 6 is changed in the course of processing the multiple semiconductor wafers W. Further, even in the processing system 10 in which the target temperature of the electrostatic chuck 6 is the fixed value or the processing system 10 in which the heater 6*c* is not provided within the electrostatic chuck 6, it is possible to suppress the temperature variation between the semiconductor wafers W due to the variation of the thermal resistance between the semiconductor wafer W and the electrostatic chuck 6.

<Hardware of Control Apparatus 200>

Figure 17:
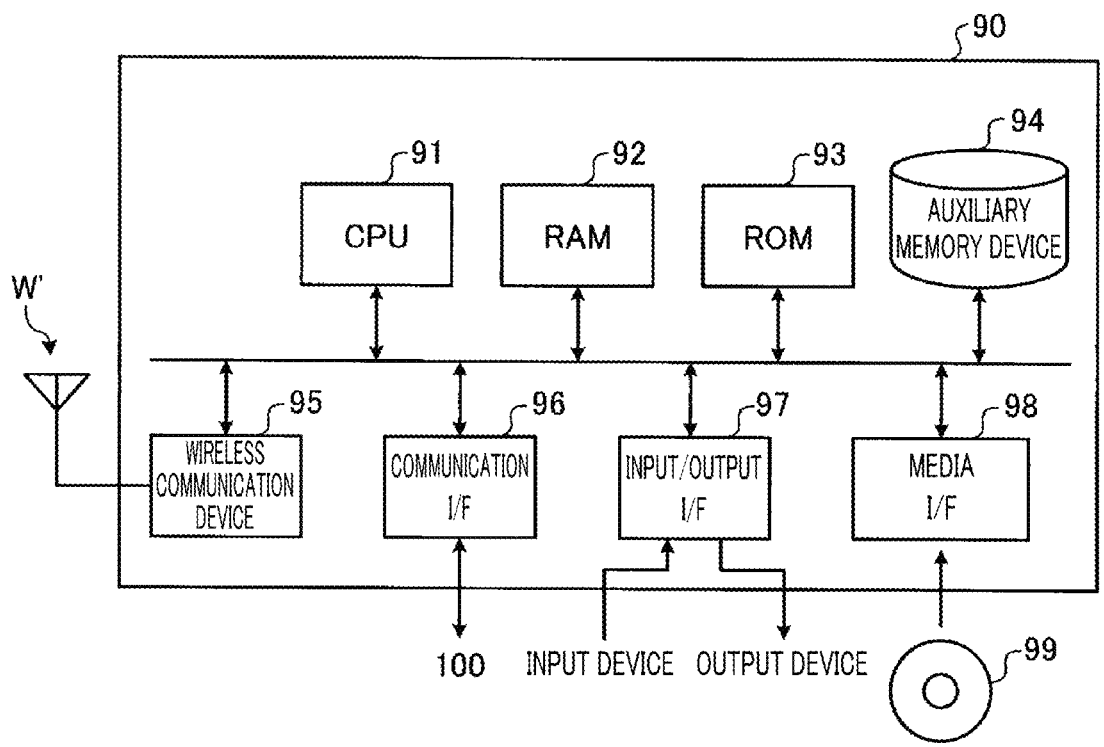
FIG. 17 is a diagram illustrating an example of a computer configured to implement a function of a control apparatus.

The control apparatus 200 according to the above-described exemplary embodiments may be implemented by a computer 90 as illustrated in FIG. 17, for example. FIG. 17 is a diagram showing an example of the computer 90 configured to perform the operations of the control apparatus 200. The computer 90 includes a CPU (Central Processing Unit) 91, a RAM (Random Access Memory) 92, a ROM (Read Only Memory) 93, an auxiliary memory device 94, a wireless communication device 95, a communication interface (I/F) 96, an input/output interface (I/F) 97 and a media interface (I/F) 98.

The CPU 91 is operated based on a program stored in the ROM 93 or the auxiliary memory device 94 and is configured to control the individual components of the apparatus. The ROM 93 is configured to store therein a boot program executed by the CPU 91 at the time of starting the computer 90, a program dependent on the hardware of the computer 90, and so forth.

The auxiliary memory device 94 is implemented by, for example, a HDD (Hard Disk Drive), a SSD (Solid State Drive), or the like, and is configured to store therein a program executed by the CPU 91, data used by this corresponding program, and so forth. The CPU 91 is configured to read the corresponding program from the auxiliary memory device 94, load the program onto the RAM 92 and execute the loaded program.

The wireless communication device 95 is configured to communicate with a temperature measurement wafer W' through wireless communications, receive data transmitted from the temperature measurement wafer W' and send the received data to the CPU 91. The communication I/F 96 is configured to communicate with the processing apparatus 100 through a communication line such as a LAN (Local Area Network). Specifically, the communication I/F 96 is configured to receive data from the processing apparatus 100, send the received data to the CPU 91 and output data generated by the CPU 91 to the processing apparatus 100 through the communication line.

The CPU 91 is also configured to control an input device such as a keyboard and an output device such as a display through the input/output I/F 97. Specifically, the CPU 91 is configured to acquire a signal input from the input device and send the acquired signal to the CPU 91 through the input/output I/F 97. Further, the CPU 91 is further configured to output the data generated by the CPU 91 to the output device through the input/output I/F 97.

The media I/F 98 is configured to read a program or data stored in a recording medium 99 and store the program or the data in the auxiliary memory device 94. The recording medium 99 may be implemented by, for example, but not limitation, an optical recording medium such as a DVD (Digital Versatile Disc) or a PD (Phase change rewritable Disk), a magneto-optical recording medium such as a MO (Magneto-Optical disk), a tape medium, a magnetic recording medium, a semiconductor memory, or the like.

The CPU 91 of the computer 90 performs the operations of the heat transfer gas control unit 201, the acquisition unit 202, the calculation unit 203, the temperature control unit 205 and the processing control unit 206 by executing the program loaded on the RAM 92. Further, the data in the storage unit 204 is also stored in the auxiliary memory device 94.

The CPU 91 of the computer 90 is configured to read the program, which is loaded onto the RAM 92, from the recording medium 99 and store the program in the auxiliary memory device 94. As another example, the program may be acquired from another apparatus through a communication line and stored in the auxiliary memory device 94.

The above-described exemplary embodiments are not limiting, and various changes and modifications may be made without departing from the scope of the subject matter described herein.

Figure 18:
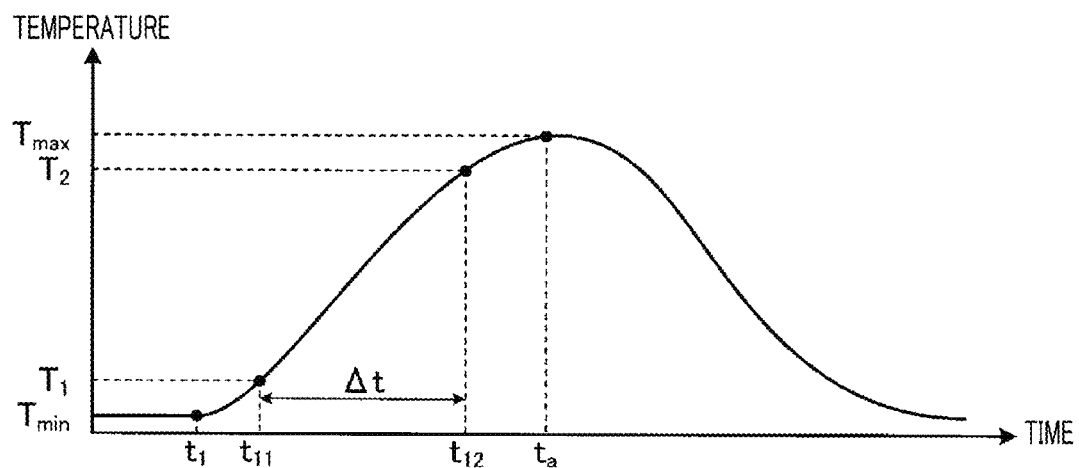
FIG. 18 is a diagram illustrating an example of a time period during which a gradient of the temperature variation of the electrostatic chuck is calculated.

By way of example, the calculation unit 203 may calculate the gradient of the temperature variation of the electrostatic chuck 6 in a period specified below as the gradient of the temperature variation of the electrostatic chuck 6 due to the thermal resistance between the semiconductor wafer W or the temperature measurement wafer W' and the electrostatic chuck 6. FIG. 18 is a diagram illustrating an example of the period in which the gradient of the temperature variation of the electrostatic chuck 6 is calculated.

As depicted in FIG. 18, for example, the temperature of the electrostatic chuck 6 is controlled to a preset temperature $T_{min}$ set by the chiller unit 33 until the time $t_1$ when the supply of the heat transfer gas is begun. At the time $t_1$ when the supply of the heat transfer gas is begun, the temperature of the electrostatic chuck 6 increases due to the heat exchange between the semiconductor wafer W or the temperature measurement wafer W' and the electrostatic chuck 6. If the power is not supplied to the heaters 6c, the temperature of the electrostatic chuck 6 is decreased after reaching a peak of a preset temperature $T_{max}$, and then, returned back to the temperature $T_{min}$ which is controlled by the chiller unit 33.

Here, in the temperature variation of the electrostatic chuck 6, for a period during which the gradient of the temperature variation is larger, the gradient of the temperature variation is more likely to be differed when the thermal resistance between the electrostatic chuck 6 and the semiconductor wafer W or the temperature measurement wafer W' is changed. On this account, it is desirable to set the time $t_{11}$ as a starting time of the period during which the gradient of the temperature variation increases and the time $t_{12}$ as an ending time between the time $t_1$ and the time $t_a$ when the temperature of the electrostatic chuck 6 is maximum, as shown in FIG. 18. By way of example, if the temperature $T_{min}$ is set to be 0% and the temperature $T_{max}$ is set to be 100%, the time $t_{11}$ may be, for example, a time when a temperature T 1 of the electrostatic chuck 6 is in the range from 10% to 30%, and the time $t_{12}$ may be, for example, a time when a temperature $T_2$ of the electrostatic chuck 6 is in the range from 70% to 90%.

Further, in the above-described exemplary embodiments, the gradient of the temperature variation of the electrostatic chuck 6 is calculated in the state that the temperature of the semiconductor wafer W or the temperature of the temperature measurement wafer W' is higher than the temperature of the electrostatic chuck 6. However, the exemplary embodiments are not limited thereto. For example, the gradient of the temperature variation of the electrostatic chuck 6 may be calculated in the state that the temperature of the semiconductor wafer W or the temperature of the temperature measurement wafer W' is lower than the temperature of the electrostatic chuck 6. In such a case, the temperature of the electrostatic chuck 6 decreases with the lapse of time. Further, in this case as well, the magnitude of the gradient of the temperature variation of the electrostatic chuck 6 is varied depending on the thermal resistance between the electrostatic chuck 6 and the semiconductor wafer W or the temperature measurement wafer W'.

Furthermore, in the above-described first exemplary embodiment, the target temperature is corrected based on the temperature variation of the electrostatic chuck 6 when processing each semiconductor wafer W. As another example, however, the process of correcting the target temperature based on the temperature variation of the electrostatic chuck 6 may be performed a single time for every preset number of semiconductor wafers W, and the semiconductor wafers W may be processed by using the corrected target temperature until a next process of correcting the target temperature is performed. In addition, in the above-described second exemplary embodiment, when processing each semiconductor wafer W, the pressure of the heat transfer gas is changed based on the temperature variation of the electrostatic chuck 6. As another example, however, the process of changing the pressure of the heat transfer gas based on the temperature variation of the electrostatic chuck 6 may be performed a single time for every preset number of semiconductor wafers W, and the semiconductor wafers W may be processed by using the changed pressure of the heat transfer gas until a next process of changing the pressure of the heat transfer gas is performed. Through these, when processing multiple semiconductor wafers W, the throughput can be improved.

Moreover, in the above-described exemplary embodiments, the top surface of the electrostatic chuck 6 is divided into the two concentric division regions 60, and the power of the heater 6c and the pressure of the heat transfer gas can be controlled for each division region 60 independently. However, the number of the division regions 60 may not be limited to two, but three or more division regions are available. Further, the division regions 60 may be formed in a lattice shape or in a radial shape without being limited to the concentric shape.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:
1. A substrate processing apparatus, comprising:
a chamber;
a substrate support within the chamber;
a plasma generator; and
a control circuitry, wherein the substrate support comprises:
a supporting surface on which a substrate is supported;
at least one heater for heating the substrate;
a heater power supply connected to the at least one heater;
a pipeline having at least one supply hole on the supporting surface;
a heat transfer gas supply unit for supplying heat transfer gas through the pipeline to a gap between the supporting surface and a rear surface of the substrate supported on the substrate support; and
at least one temperature sensor for measuring a temperature of the substrate support,
wherein the control circuitry is configured to control the heater power supply, the heat transfer gas supply unit and the at least one temperature sensor to perform:
(a) supplying, in a state that a supply of a power to the at least one heater is stopped or in a state that the power supplied to the at least one heater is maintained to be constant, the heat transfer gas into the gap between the rear surface of the substrate and the supporting surface through the pipeline;
(b) measuring a temperature variation of the substrate support;
(c) calculating a correction value based on the temperature variation of the substrate support; and
(d) acquiring the temperature of the substrate support and adjusting the temperature of the substrate support to a target temperature corrected with the correction value.

2. The substrate processing apparatus of claim 1,
wherein, in (a), a temperature of the substrate is different from the temperature of the substrate support.

3. The substrate processing apparatus of claim 1,
wherein the at least one supply hole is provided at a position covered by the substrate when the substrate is placed on the supporting surface.

4. The substrate processing apparatus of claim 1,
wherein the supporting surface is divided into multiple division regions, and
each of the multiple division regions is provided with the heater, the supply hole and the temperature sensor.

5. The substrate processing apparatus of claim 1,
wherein the substrate support is connected to a chiller, and is provided with a flow path through which a coolant supplied from the chiller flows.

6. The substrate processing apparatus of claim 5,
wherein, in (d), the control circuitry is configured to control the temperature of the substrate support by the at least one heater and/or the chiller.

7. A substrate processing apparatus, comprising:
a chamber;
a substrate support within the chamber;
a plasma generator; and
a control circuitry including a heat transfer gas control unit, an acquisition unit, a calculation unit, a temperature control unit, and a process control unit,
wherein the substrate support comprises:
a flow path, connected to a chiller, through which a coolant supplied from the chiller flows;
a supporting surface on which a substrate is supported;
at least one heater for heating the substrate;
a heater power supply connected to the at least one heater;
a pipeline having at least one supply hole on the supporting surface;
a heat transfer gas supply unit for supplying heat transfer gas through the pipeline to a gap between the supporting surface and a rear surface of the substrate supported on the substrate support; and
at least one temperature sensor for measuring a temperature of the substrate support,
wherein the heat transfer gas control unit is configured to control, in a state that a supply of a power to the at least one heater is stopped or in a state that the power supplied to the at least one heater is maintained to be constant, the heat transfer gas supply unit to supply the heat transfer gas through the pipeline to the gap between the supporting surface and the rear surface of the substrate supported on the supporting surface,
wherein the acquisition unit is configured to acquire a temperature variation of the substrate support measured by the at least one temperature sensor,
wherein the calculation unit is configured to calculate a correction value based on the temperature variation of the substrate support, and
wherein the temperature control unit is configured to acquire the temperature of the substrate support and control the at least one temperature sensor, and at least one of the chiller and the at least one heater, to adjust the temperature of the substrate support to a target temperature corrected by the correction value.

8. The substrate processing apparatus of claim 7,
wherein the control circuitry further comprises a storage unit in which a correction table is stored, and
the calculation unit is further configured to calculate the correction value based on the temperature variation of the substrate support with reference to the correction table.

9. The substrate processing apparatus of claim 1,
wherein, in (b), a gradient of the temperature variation of the substrate support in a time period between a first time point upon a lapse of a first time after the heat transfer gas is supplied into the gap between the rear surface of the substrate and the supporting surface and a second time point upon a lapse of a second time from the first time point is measured as the temperature variation of the substrate support.

10. The substrate processing apparatus of claim 9,
wherein, (b) further comprises:
(b-1) measuring, after supplying, in the state that the supply of the power to the at least one heater configured to heat the substrate support is stopped or in the state that the power supplied to the at least one heater is maintained to be constant, the heat transfer gas into the gap between a temperature measurement wafer having a temperature different from the temperature of the substrate support and the substrate support on which the temperature measurement wafer is supported and after measuring the temperature variation of the substrate support due to heat exchange between the temperature measurement wafer and the substrate support through the heat transfer gas, the temperature of the temperature measurement wafer by controlling the power to the at least one heater such that the temperature of the substrate support reaches a preset temperature; and
(b-2) creating a correction table in which, for each of different pressures of the heat transfer gas, the temperature variation of the substrate support measured in (b-1) corresponds to the correction value according to a difference between the temperature of the temperature measurement wafer measured in (b-1) and a reference temperature,
wherein the correction value based on the temperature variation of the substrate support is calculated from the correction table in (c).

11. The substrate processing apparatus of claim 1,
wherein the control circuitry is configured to control the heater power supply, the heat transfer gas supply unit and at least one temperature sensor to perform (a), (b), (c) and (d), on the substrate before the substrate is processed.

12. The substrate processing apparatus of claim 1,
wherein the at least one heater is plural in number, and
the heaters are provided within the substrate support in concentric shapes having different radii when viewed from above the substrate support.

13. The substrate processing apparatus of claim 12,
wherein the correction value based on the temperature variation of the substrate support is calculated for each of the heaters in (c), and
the power to each of the heaters is controlled such that the temperature of the substrate support reaches the target temperature in (d).

14. The substrate processing apparatus of claim 7,
wherein the acquisition unit is configured to acquire a gradient of the temperature variation of the substrate support in a time period between a first time point upon a lapse of a first time after the heat transfer gas is supplied into the gap between the rear surface of the substrate and the supporting surface and a second time point upon a lapse of a second time from the first time point as the temperature variation of the substrate support.

15. The substrate processing apparatus of claim 14,
wherein the acquisition unit is further configured to:
measure, after supplying, in the state that the supply of the power to the at least one heater configured to heat the substrate support is stopped or in the state that the power supplied to the at least one heater is maintained to be constant, the heat transfer gas into the gap between a temperature measurement wafer having a temperature different from the temperature of the substrate support and the substrate support on which the temperature measurement wafer is supported and after measuring the temperature variation of the substrate support due to heat exchange between the temperature measurement wafer and the substrate support through the heat transfer gas, the temperature of the temperature measurement wafer by controlling the power to the at least one heater such that the temperature of the substrate support reaches a preset temperature; and
create a correction table in which, for each of different pressures of the heat transfer gas, the temperature variation of the substrate support corresponds to the correction value according to a difference between the temperature of the temperature measurement wafer and a reference temperature, wherein the calculation unit is further configured to calculate the correction value based on the temperature variation of the substrate support from the correction table.

16. The substrate processing apparatus of claim 7,
wherein the heat transfer gas control unit, the acquisition unit, the calculation unit and the temperature control unit are configured to perform each process on the substrate before the process control unit performs a process on the substrate.

17. The substrate processing apparatus of claim 7,
wherein the at least one heater is plural in number, and
the heaters are provided within the substrate support in concentric shapes having different radii when viewed from above the substrate support.

18. The substrate processing apparatus of claim 17,
wherein the calculation unit is configured to calculate the correction value based on the temperature variation of the substrate support for each of the heaters, and
the temperature control unit is configured to control the power to each of the heaters such that the temperature of the substrate support reaches the target temperature.

19. A substrate processing method by using a substrate processing apparatus comprising a chamber; a substrate support within the chamber; and a plasma generator, wherein the substrate support comprises: a supporting surface on which a substrate is supported; at least one heater for heating the substrate; a heater power supply connected to the at least one heater; a pipeline having at least one supply hole on the supporting surface; a heat transfer gas supply unit for supplying heat transfer gas through the pipeline to a gap between the supporting surface and a rear surface of the substrate supported on the substrate support; and at least one temperature sensor for measuring a temperature of the substrate support,
the substrate processing method comprises:
(a) supplying, in a state that a supply of a power to the at least one heater is stopped or in a state that the power supplied to the at least one heater is maintained to be constant, the heat transfer gas into the gap between the rear surface of the substrate and the supporting surface through the pipeline;
(b) measuring a temperature variation of the substrate support;
(c) calculating a correction value based on the temperature variation of the substrate support; and
(d) acquiring the temperature of the substrate support and adjusting the temperature of the substrate support to a target temperature corrected with the correction value.

* * * * *